(12) United States Patent
Park et al.

(10) Patent No.: US 11,869,829 B2
(45) Date of Patent: Jan. 9, 2024

(54) SEMICONDUCTOR DEVICE WITH THROUGH-MOLD VIA

(71) Applicant: Amkor Technology Singapore Holding Pte. Ltd, Valley Point (SG)

(72) Inventors: Dong Joo Park, Seoul (KR); Jin Seong Kim, Seoul (KR); Ki Wook Lee, Seoul (KR); Dae Byoung Kang, Kyunggi-do (KR); Ho Choi, Seoul (KR); Kwang Ho Kim, Kyunggi-do (KR); Jae Dong Kim, Seoul (KR); Yeon Soo Jung, Seoul (KR); Sung Hwan Cho, Kyunggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 188 days.

(21) Appl. No.: 16/925,599

(22) Filed: Jul. 10, 2020

(65) Prior Publication Data

US 2020/0343163 A1    Oct. 29, 2020

Related U.S. Application Data

(62) Division of application No. 16/025,465, filed on Jul. 2, 2018, now Pat. No. 10,811,341, which is a division
(Continued)

(51) Int. Cl.
*H01L 23/482* (2006.01)
*H01L 23/498* (2006.01)
(Continued)

(52) U.S. Cl.
CPC ........ *H01L 23/482* (2013.01); *H01L 23/3128* (2013.01); *H01L 23/481* (2013.01);
(Continued)

(58) Field of Classification Search
CPC . H01L 23/482; H01L 23/3128; H01L 23/481; H01L 23/49816; H01L 23/49827;
(Continued)

(56) References Cited

U.S. PATENT DOCUMENTS

| 2,596,993 A | 5/1952 | Gookin |
| 3,435,815 A | 4/1969 | Forcier |

(Continued)

FOREIGN PATENT DOCUMENTS

| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.
(Continued)

*Primary Examiner* — Ori Nadav
(74) *Attorney, Agent, or Firm* — Kevin B. Jackson

(57) ABSTRACT

In accordance with the present description, there is provided multiple embodiments of a semiconductor device. In each embodiment, the semiconductor device comprises a substrate having a conductive pattern formed thereon. In addition to the substrate, each embodiment of the semiconductor device includes at least one semiconductor die which is electrically connected to the substrate, both the semiconductor die and the substrate being at least partially covered by a package body of the semiconductor device. In certain embodiments of the semiconductor device, through-mold vias are formed in the package body to provide electrical signal paths from an exterior surface thereof to the conductive pattern of the substrate. In other embodiments, through mold vias are also included in the package body to provide
(Continued)

electrical signal paths between the semiconductor die and an exterior surface of the package body. Other embodiments of the semiconductor device comprise one or more interposers which are electrically connected to the through-mold vias, and may be covered by the package body and/or disposed in spaced relation thereto. In yet other embodiments of the semiconductor device, the interposer may not be electrically connected to the through mold vias, but may have one or more semiconductor dies of the semiconductor device electrically connected thereto.

12 Claims, 15 Drawing Sheets

Related U.S. Application Data of application No. 15/390,568, filed on Dec. 26, 2016, now abandoned, which is a division of application No. 12/348,813, filed on Jan. 5, 2009, now abandoned.

(51) Int. Cl.
| | |
|---|---|
| *H01L 25/065* | (2023.01) |
| *H01L 23/48* | (2006.01) |
| *H01L 23/31* | (2006.01) |
| *H01L 25/03* | (2006.01) |
| *H01L 23/00* | (2006.01) |
| *H01L 25/10* | (2006.01) |
| *H01L 23/538* | (2006.01) |

(52) U.S. Cl.
CPC .. *H01L 23/49816* (2013.01); *H01L 23/49827* (2013.01); *H01L 24/73* (2013.01); *H01L 25/03* (2013.01); *H01L 25/0657* (2013.01); *H01L 25/10* (2013.01); *H01L 23/5389* (2013.01); *H01L 24/16* (2013.01); *H01L 24/24* (2013.01); *H01L 24/32* (2013.01); *H01L 2224/04105* (2013.01); *H01L 2224/06181* (2013.01); *H01L 2224/13025* (2013.01); *H01L 2224/16227* (2013.01); *H01L 2224/16237* (2013.01); *H01L 2224/16238* (2013.01); *H01L 2224/17181* (2013.01); *H01L 2224/244* (2013.01); *H01L 2224/24227* (2013.01); *H01L 2224/32145* (2013.01); *H01L 2224/32225* (2013.01); *H01L 2224/73253* (2013.01); *H01L 2224/73259* (2013.01); *H01L 2224/73265* (2013.01); *H01L 2224/73267* (2013.01); *H01L 2224/81191* (2013.01); *H01L 2224/92224* (2013.01); *H01L 2225/0651* (2013.01); *H01L 2225/06517* (2013.01); *H01L 2225/06548* (2013.01); *H01L 2225/06572* (2013.01); *H01L 2225/06582* (2013.01); *H01L 2924/15311* (2013.01); *H01L 2924/15331* (2013.01); *H01L 2924/181* (2013.01); *H01L 2924/18161* (2013.01); *H01L 2924/19107* (2013.01)

(58) Field of Classification Search
CPC ..... H01L 24/73; H01L 25/03; H01L 25/0657; H01L 25/10
USPC .......................................................... 257/738
See application file for complete search history.

(56) References Cited

U.S. PATENT DOCUMENTS

| | | |
|---|---|---|
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,696 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,250,843 A | 10/1993 | Eichelberger |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,299,647 A | 4/1994 | Mudd et al. |
| 5,327,008 A | 6/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,356,661 A * | 10/1994 | Doi ................ C23C 16/0272 427/124 |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |

(56) References Cited

U.S. PATENT DOCUMENTS

| | | |
|---|---|---|
| 5,417,905 A | 5/1995 | LeMaire et al. |
| 5,424,576 A | 6/1995 | Djennas et al. |
| 5,434,057 A | 7/1995 | Bindra et al. |
| 5,428,248 A | 8/1995 | Cha |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,528,076 A | 8/1996 | Pavio |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 6/1997 | Abbott et al. |
| 5,639,990 A | 6/1997 | Nishihara et al. |
| 5,641,997 A | 6/1997 | Ohta et al. |
| 5,661,088 A | 6/1997 | Tessier et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,637,922 A | 8/1997 | Fillion et al. |
| 5,640,047 A | 8/1997 | Nakashima |
| 5,665,996 A | 9/1997 | Williams et al. |
| 5,673,479 A | 10/1997 | Hawthorne |
| 5,682,062 A | 10/1997 | Gaul |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,661 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,870,289 A | 2/1999 | Tokuda et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,130,823 A * | 10/2000 | Lauder ................ H01L 25/105 361/764 |
| 6,143,981 A | 11/2000 | Glenn |
| 6,150,709 A | 11/2000 | Shin et al. |
| 6,166,430 A | 12/2000 | Yamaguchi |
| 6,168,969 B1 | 1/2001 | Farnworth |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,495,909 B2 | 2/2002 | Jung et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |

(56) References Cited

U.S. PATENT DOCUMENTS

| | | |
|---|---|---|
| 6,369,454 B1 | 4/2002 | Chung |
| 6,373,127 B1 | 4/2002 | Baudouin et al. |
| 6,377,464 B1 | 4/2002 | Hashemi et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Oloffson |
| 6,472,735 B2 | 10/2002 | Isaak |
| 6,492,718 B2 | 10/2002 | Ohmori et al. |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,489,676 B2 | 12/2002 | Taniguchi |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,345 B1 | 4/2003 | Glenn et al. |
| 6,545,348 B1 | 4/2003 | Takano |
| 6,552,421 B2 | 4/2003 | Kishimoto et al. |
| 6,559,525 B2 | 5/2003 | Huang |
| 6,566,168 B2 | 5/2003 | Gang |
| 6,573,461 B2 | 6/2003 | Roeters et al. |
| 6,577,013 B1 | 6/2003 | Glenn |
| 6,580,161 B2 | 6/2003 | Kobayakawa |
| 6,583,503 B2 | 6/2003 | Akram et al. |
| 6,545,332 B2 | 7/2003 | Huang |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,740,964 B2 | 5/2004 | Sasaki |
| 6,757,178 B2 | 6/2004 | Okabe et al. |
| 6,780,770 B2 | 8/2004 | Larson |
| 6,800,936 B2 | 10/2004 | Kosemura et al. |
| 6,812,552 B2 | 11/2004 | Islam et al. |
| 6,818,973 B1 | 11/2004 | Foster |
| 6,828,665 B2 | 12/2004 | Pu |
| 6,838,761 B2 | 1/2005 | Karnezos |
| 6,847,109 B2 | 1/2005 | Shim |
| 6,858,919 B2 | 2/2005 | Seo et al. |
| 6,861,288 B2 | 3/2005 | Shim et al. |
| 6,867,492 B2 | 3/2005 | Auburger et al. |
| 6,873,054 B2 | 3/2005 | Miyazawa et al. |
| 6,876,068 B1 | 4/2005 | Lee et al. |
| 6,878,571 B2 | 4/2005 | Isaak et al. |
| 6,897,552 B2 | 5/2005 | Nakao |
| 6,906,416 B2 | 6/2005 | Karnezos |
| 6,853,572 B1 | 8/2005 | Sabharwal |
| 6,933,598 B2 | 8/2005 | Karnezos |
| 6,927,478 B2 | 9/2005 | Paek |
| 6,946,323 B1 | 9/2005 | Heo |
| 6,967,125 B2 | 11/2005 | Fee et al. |
| 6,972,481 B2 | 12/2005 | Karnezos |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,034,387 B2 | 4/2006 | Karnezos |
| 7,045,396 B2 | 5/2006 | Crowley et al. |
| 7,045,887 B2 | 5/2006 | Karnezos |
| 7,049,691 B2 | 5/2006 | Karnezos |
| 7,053,469 B2 | 5/2006 | Koh et al. |
| 7,053,476 B2 | 5/2006 | Karnezos |
| 7,053,477 B2 | 5/2006 | Karnezos |
| 7,057,269 B2 | 6/2006 | Karnezos |
| 7,061,088 B2 | 6/2006 | Karnezos |
| 7,064,426 B2 | 6/2006 | Karnezos |
| 7,081,661 B2 | 6/2006 | Takehara et al. |
| 7,075,816 B2 | 7/2006 | Fee et al. |
| 7,101,731 B2 | 9/2006 | Karnezos |
| 7,102,209 B1 | 9/2006 | Bayan et al. |
| 7,109,572 B2 | 9/2006 | Fee et al. |
| 7,125,744 B2 | 10/2006 | Takehara et al. |
| 7,166,494 B2 | 1/2007 | Karnezos |
| 7,169,642 B2 | 1/2007 | Karnezos |
| 7,245,007 B1 | 1/2007 | Foster |
| 7,185,426 B1 | 3/2007 | Hiner et al. |
| 7,193,298 B2 | 3/2007 | Hong et al. |
| 7,202,554 B1 | 4/2007 | Kim et al. |
| 7,205,647 B2 | 4/2007 | Karnezos |
| 7,211,471 B1 | 5/2007 | Foster |
| 7,242,081 B1 | 7/2007 | Lee |
| 7,247,519 B2 | 7/2007 | Karnezos |
| 7,253,503 B1 | 8/2007 | Fusaro et al. |
| 7,253,511 B2 | 8/2007 | Karnezos et al. |
| 7,271,496 B2 | 9/2007 | Kim |
| 7,276,799 B2 | 10/2007 | Lee |
| 7,279,361 B2 | 10/2007 | Karnezos |
| 7,288,434 B2 | 10/2007 | Karnezos |
| 7,288,835 B2 | 10/2007 | Yim et al. |
| 7,298,037 B2 | 11/2007 | Yim et al. |
| 7,298,038 B2 | 11/2007 | Filoteo, Jr. et al. |
| 7,306,973 B2 | 11/2007 | Karnezos |
| 7,312,519 B2 | 12/2007 | Song et al. |
| 7,345,361 B2 | 3/2008 | Mallik |
| 7,372,151 B1 | 5/2008 | Fan et al. |
| 7,602,047 B2 | 10/2009 | Kwon et al. |
| 7,642,133 B2 | 1/2010 | Wu |
| 7,671,457 B1 | 3/2010 | Hiner |
| 7,737,539 B2 | 6/2010 | Kwon |
| 7,777,351 B1 | 8/2010 | Berry |
| 7,939,947 B2 | 5/2011 | Kwon et al. |
| 7,960,210 B2 | 6/2011 | Trezza |
| 8,082,537 B1 | 12/2011 | Rahman |
| 2001/0008305 A1 | 7/2001 | McClellan et al. |
| 2001/0011654 A1 | 8/2001 | Schmidt |
| 2001/0044538 A1 | 8/2001 | Kwan et al. |
| 2002/0017710 A1 | 2/2002 | Kurashima |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0061642 A1 | 5/2002 | Haji et al. |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |

(56) References Cited

U.S. PATENT DOCUMENTS

| | | |
|---|---|---|
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0164387 A1 | 4/2004 | Ikenaga et al. |
| 2004/0089926 A1 | 5/2004 | Hsu et al. |
| 2004/0222508 A1 | 11/2004 | Aoyagi |
| 2004/0253803 A1 | 12/2004 | Tomono et al. |
| 2005/0046002 A1 | 3/2005 | Lee et al. |
| 2006/0087020 A1 | 4/2006 | Hirano et al. |
| 2006/0157843 A1 | 7/2006 | Hwang |
| 2006/0231939 A1 | 10/2006 | Kawabata et al. |
| 2007/0007639 A1 | 1/2007 | Fukazawa |
| 2007/0023202 A1 | 2/2007 | Shibata |
| 2007/0210433 A1 | 9/2007 | Subraya et al. |
| 2008/0017968 A1 | 1/2008 | Choi |
| 2008/0136003 A1 | 6/2008 | Pendse |
| 2008/0230887 A1 | 9/2008 | Sun |
| 2008/0258289 A1 | 10/2008 | Pendse |
| 2009/0302437 A1 | 12/2009 | Kim et al. |
| 2010/0019360 A1 | 1/2010 | Khan |
| 2011/0304349 A1 | 12/2011 | Stillman et al. |
| 2012/0306078 A1 | 12/2012 | Pagaila |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6323854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369203 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

\* cited by examiner

SEMICONDUCTOR DEVICE WITH THROUGH-MOLD VIA

CROSS-REFERENCE TO RELATED APPLICATIONS

This application is a divisional application of co-pending U.S. patent application Ser. No. 16/025,465 filed on Jul. 2, 2018, which is a divisional application of U.S. patent application Ser. No. 15/390,568 filed on Dec. 26, 2016, which is a divisional application of U.S. patent application Ser. No. 12/348,813 filed on Jan. 5, 2009, both of which are expressly incorporated by reference herein.

STATEMENT RE: FEDERALLY SPONSORED RESEARCH/DEVELOPMENT

Not Applicable

BACKGROUND

1. Field of the Invention

The present invention relates generally to semiconductor devices, and more particularly to a semiconductor device having a thin profile and optimized electrical signal paths to provide enhanced electrical performance.

2. Description of the Related Art

The variety of electronic devices utilizing semiconductor devices or packages has grown dramatically in recent years. These electronic devices include cellular phones, portable computers, etc. Each of these electronic devices typically includes a printed circuit board on which a significant number of such semiconductor devices or packages are secured to provide multiple electronic functions. These electronic devices are typically manufactured in reduced sizes and at reduced costs, which results in increased consumer demand. However, even though many semiconductor devices have been miniaturized, space on a printed circuit board remains limited and precious. Thus, there is a continuing need to develop semiconductor device designs (e.g., semiconductor devices which are of increasingly reduced thickness) to maximize the number of semiconductor devices that may be integrated into an electronic device, yet minimize the space needed to accommodate these semiconductor devices. The need also exists for new semiconductor device designs to possess increased functionality, despite the smaller size of slimmer/thinner profiles thereof.

One method to minimize the space needed to accommodate semiconductor devices is to stack plural semiconductor dies in a single semiconductor device which is itself fabricated to be of a reduced size. However, semiconductor devices including stacked plural semiconductor dies are typically connected to an external circuit board through the use of solder balls or lands disposed solely on a lower external surface thereof. In this regard, when the size of the semiconductor device itself is reduced, the available space for input/output terminals (e.g., lands) is restricted. As a result, when the size of the semiconductor device is reduced, it is often difficult to realize various functions thereof due the insufficient availability of input/output terminals. Stated another way, when plural semiconductor dies are stacked in a single semiconductor device, the need arises for an increased number of input/output terminals for inputting/outputting electrical signals to each semiconductor die, though the smaller size of the semiconductor device creates limits in the available space for increasing the number of input/output terminals. Thus, the problem that arises is that is often difficult to form the input/output terminals when the size of the semiconductor device is reduced. When the input/output terminals are formed using solder balls, this particular problem becomes even more severe due to the volume of solder balls.

In an effort to address the aforementioned problems, there has been developed POP (package on package) technology to stack a semiconductor device on another semiconductor device, and PIP (package in package) technology to install a semiconductor device in another semiconductor device. A typical PIP semiconductor device comprises various combinations of electronic components including passive devices, semiconductor dies, semiconductor packages, and/or other elements which are arranged in a horizontal direction, or stacked in a vertical direction on an underlying substrate. In many PIP devices, the substrate and the electronic components are interconnected to one another through the use of conductive wires alone or in combination with conductive bumps, with such electronic components thereafter being encapsulated by a suitable encapsulant material which hardens into a package body of the PIP device. However, the drawbacks of both POP and PIP technology is that it is difficult to secure and stack the input/output terminals through the use of either technology as a result of the input/output terminals of the semiconductor device typically being formed only on one surface (e.g., the lower surface) thereof. The present invention addresses these and other shortcomings of prior art POP and PIP devices, as will be described in more detail below.

BRIEF SUMMARY

In accordance with the present invention, there is provided multiple embodiments of a semiconductor device. In each embodiment, the semiconductor device comprises a substrate having a conductive pattern formed thereon. In addition to the substrate, each embodiment of the semiconductor device includes at least one semiconductor die which is electrically connected to the substrate, both the semiconductor die and the substrate being at least partially covered by a package body of the semiconductor device. In certain embodiments of the semiconductor device, through-mold vias are formed in the package body to provide electrical signal paths from an exterior surface thereof to the conductive pattern of the substrate. In other embodiments, through mold vias are also included in the package body to provide electrical signal paths between the semiconductor die and an exterior surface of the package body. Other embodiments of the semiconductor device comprise one or more interposers which are electrically connected to the through-mold vias, and may be covered by the package body and/or disposed in spaced relation thereto. In yet other embodiments of the semiconductor device, the interposer may not be electrically connected to the through mold vias, but may have one or more semiconductor dies of the semiconductor device electrically connected thereto.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE DRAWINGS

Figure 1:
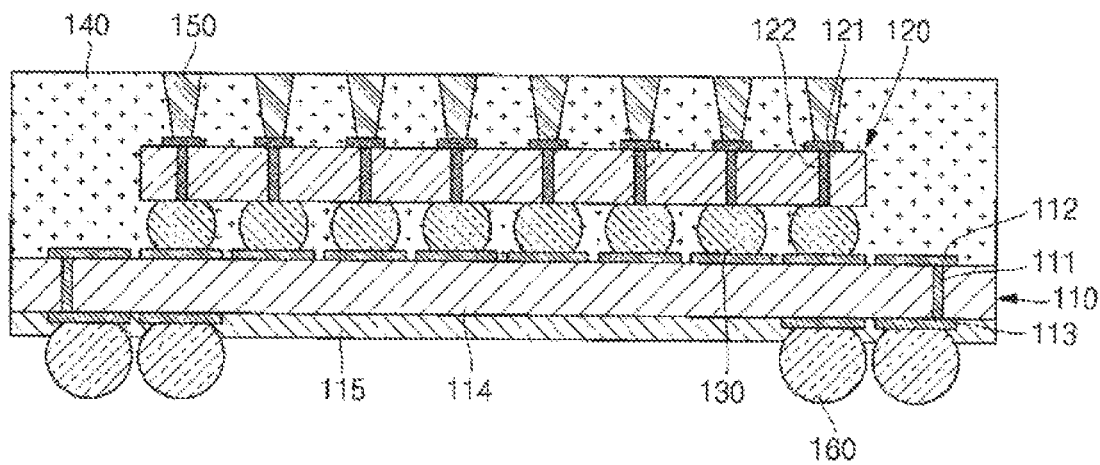
FIG. 1 is a cross-sectional view of a semiconductor device constructed in accordance with a first embodiment of the present invention.

Referring now to the drawings wherein the showings are for purposes of illustrating various embodiments of the present invention and not for purposes of limiting the same, FIG. 1 depicts in cross-section a semiconductor device 100 constructed in accordance with a first embodiment of the present invention. The semiconductor device 100 comprises a substrate 110 which preferably has a generally quadrangular configuration. The substrate 110 can be selected from common circuit boards (e.g., rigid circuit boards and flexible circuit boards) and equivalents thereof. In this regard, the present invention is not intended to be limited to any particular type of substrate 110. By way of example and not by way of limitation, the substrate 110 may include an insulating layer 114 having opposed, generally planar top and bottom surfaces. Disposed on the top surface is an electrically conductive pattern 112, while disposed on the bottom surface are conductive lands 113. The conductive pattern 112 and lands 113 are electrically interconnected to each other in a prescribed pattern or arrangement through the use of conductive vias 111 which extend through the insulation layer 114 in a direction generally perpendicularly between the top and bottom surfaces thereof. A solder mask 115 is preferably coated on at least portions of the lands 113 and the bottom surface of the insulating layer 114. The solder mask 115 is used to protect portions of the lands 113 which would otherwise be exposed to the ambient environment.

The semiconductor device 100 further comprises a semiconductor die 120 which is electrically connected to the substrate 110, and in particular to the conductive pattern 112 thereof. The semiconductor die 120 defines opposed, generally planar top and bottom surfaces, and includes a plurality of terminals or bond pads 121 disposed on the top surface thereof. In FIG. 1, each of the bond pads 121 is depicted as projecting upwardly from the generally planar top surface of the semiconductor die 120. However, those of ordinary skill in the art will recognize that each of the bond pads 121 may be partially embedded within the semiconductor 120 so as to extend in substantially flush relation to the top surface thereof. The semiconductor die 120 further includes a plurality of through electrodes 122 formed therein and passing between the top and bottom surfaces thereof. As seen in FIG. 1, one end (the top end as viewed from the perspective shown in FIG. 1) of each electrode 122 is electrically coupled to a respective one of the bond pads 121, with the remaining end (the bottom end as viewed from the perspective shown in FIG. 1) extending to the bottom surface of the semiconductor die 120.

As further seen in FIG. 1, each of the electrodes 122 is electrically connected to the conductive pattern 112 of the substrate 110 through the use of respective ones of a plurality of conductive bumps 130. Examples of suitable material for the conductive bumps 130 include, but are not limited to, gold, silver, copper, soldering materials or equivalents thereto. As will be recognized by those of ordinary skill in the art, the conductive bumps 130, which are formed between the semiconductor die 120 and the substrate 110, effectively transmit electrical signals between the semiconductor die 120 and the substrate 110. Though not shown, it is contemplated that an underfill material may be disposed between the bottom surface of the semiconductor die 120 and the top surface of the insulating layer 114, the underfill material also covering portions of the conductive pattern 112 and the conductive bumps 130. The underfill material, if included, would serve to protect the semiconductor die 120 by absorbing stress according to differences between the thermal expansion coefficients of the substrate 110 and the semiconductor die 120. It is contemplated that the semiconductor die 120 may comprise a circuit that includes transistors, resistors and capacitors integrated on a silicon substrate.

The semiconductor device 100 further comprises a plurality of solder balls 160 which are electrically connected to the respective ones of the lands 113 of the substrate 110 in a prescribed pattern or arrangement. As seen in FIG. 1, the solder mask 115 extends into contact with the solder balls 160. Examples of suitable materials for the solder balls 160 include, but are not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi), or equivalents thereto. As will be recognized, the solder balls 160 are used to electrically couple the substrate 110, and hence the semiconductor die 120, to an external circuit.

In the semiconductor device 100, at least portions of the semiconductor die 120, the conductive bumps 130, the top surface of the insulating layer 114, and the conductive pattern 112 are each encapsulated or covered by an encapsulant material which ultimately hardens into a package body 140 of the semiconductor device 100. The present invention is not intended to be limited to any specific material which could be used to facilitate the fabrication of the package body 140. For example, and not by way of limitation, the package body 140 can be formed from epoxy molding compounds or equivalents thereto. The fully formed package body 140 preferably includes a generally planar top surface, and generally planar side surfaces which extend in generally flush or co-planar relation to respective side surfaces of the insulating layer 114 of the substrate 110.

In the semiconductor device 100, the package body 140 includes a plurality of through-mold vias 150 formed therein. Each through-mold via (TMV) 150 extends from the top surface of the package body 140 to a respective one of the bond pads 121 disposed on the top surface of the semiconductor die 120. Each TMV 150 is preferably formed by creating a hole in the package body 140 using a laser or an etching solution, and filling such hole with a conductive material selected from copper, aluminum, gold, silver, tin, lead, bismuth, soldering materials or equivalents thereto. In this regard, it is contemplated that the fabrication of each TMV 150 may be facilitated by the completion of a reflow process subsequent to placing a ball fabricated from one of the aforementioned materials on top of the hole formed in the package body 140 through the use of one of the aforementioned processes.

As seen in FIG. 1, each TMV 150 has a generally conical configuration. More particularly, each TMV 150 is of a first diameter at a respective one of the bond pads 121, and a second diameter at the top surface of the package body 140, the second diameter exceeding the first diameter. As such, each TMV 150 defines a continuous side wall which is inclined at a predetermined angle relative to the top surface of the package body 140. As will be recognized by those of ordinary skill in the art, each TMV 150 creates an electrically conductive path from the semiconductor die 120 to the top surface of the package body 140, whereas the conductive bumps 130, substrate 110 and solder balls 160 collectively define an electrically conductive path which extends from the semiconductor die 120 in an opposite direction, such as toward an underlying substrate to which the semiconductor device 110 may ultimately be electrically connected through the use of the solder balls 160. Those of ordinary skill in the art will recognize that each TMV 150 may have a shape or configuration differing from that shown in FIG. 1 without departing from the spirit and scope of the present invention.

Due to the inclusion of the TMV's 150 therein, the semiconductor device 100 is particularly suited for having another semiconductor device stacked thereon and electrically connected thereto. In this regard, the lands or solder balls of a second semiconductor device can be electrically coupled to respective ones of the TMV's 150 exposed in the top surface of the package body 140. Along these lines, it is contemplated that the end of each TMV 150 extending to the top surface of the package body 140 have a generally concave configuration to partially accommodate the solder balls of a conventional BGA (Ball Grid Array) semiconductor device which may be stacked upon the semiconductor device 100, thus reducing the overall height or profile of the stack. Another semiconductor device suitable for stacking upon the semiconductor device 100 is an LGA (Land Grid Array) device, the stack comprising the semiconductor device 100 and the LGA device also being of comparatively reduced thickness due to the use of the TMV's 150 to facilitate the electrical interconnection therebetween.

Figure 10:
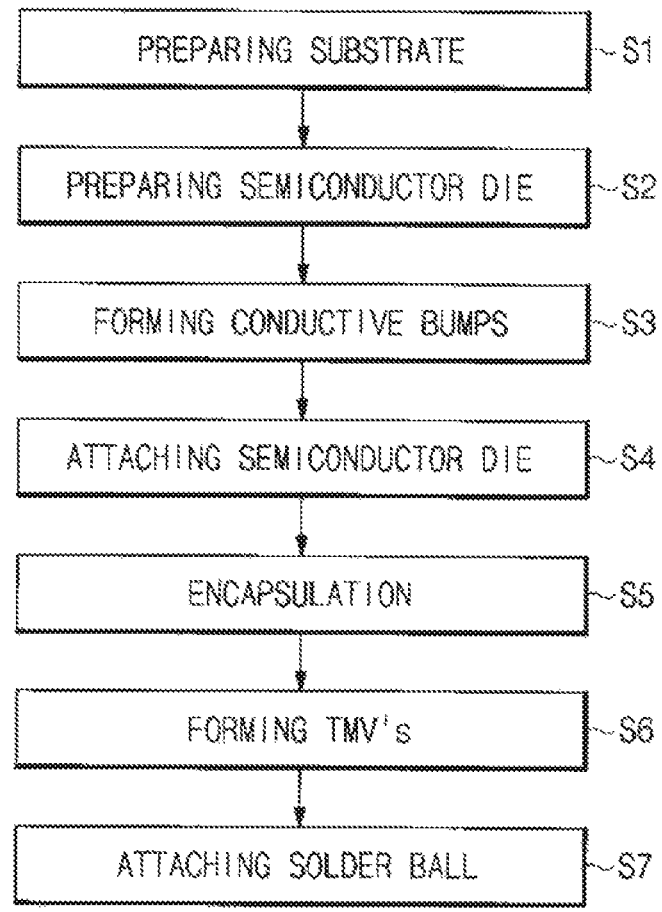
FIG. 10 is a flow chart illustrating an exemplary fabrication method for the semiconductor device shown in FIG. 1.

Referring now to FIG. 10, there is provided a flow chart which sets forth an exemplary method for fabricating the semiconductor device 100 of the present invention shown in FIG. 1. The method comprises the steps of preparing the substrate (S1), preparing the semiconductor die (S2), forming conductive bumps on the semiconductor die (S3), attaching and electrically connecting the semiconductor die to the substrate (S4), encapsulation to form a package body (S5), forming TMV's in the package body (S6), and the connection of solder balls to the substrate (S7). FIGS. 11A-11H provide illustrations corresponding to these particular steps, as will be discussed in more detail below.

Figure 11A:
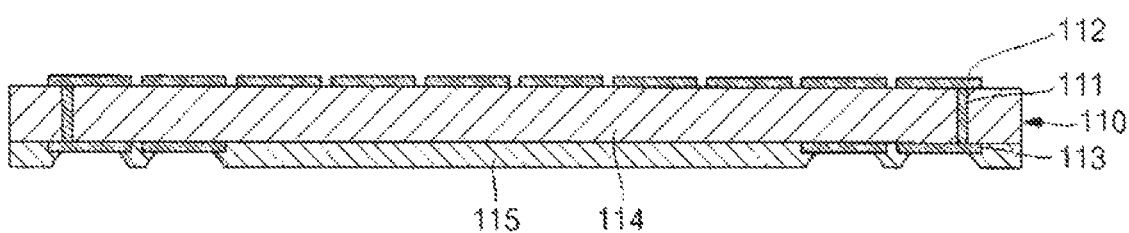
FIGS. 11A, 11B, 11C, 11D, 11E, 11F, 11G, and 11H are views illustrating an exemplary fabrication method for the semiconductor package shown in FIG. 1.

Referring now to FIG. 11A, in the initial step S1 of the fabrication process for the semiconductor device 100, the substrate 110 having the above-described structural attributes is provided. As indicated above, a solder mask 115 may be coated on at least portions of the lands 113 and the bottom surface of the insulating layer 114.

Figure 11B:
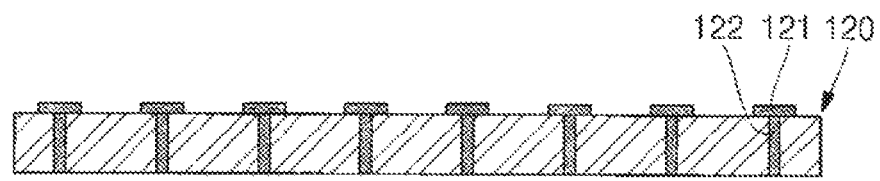
Figure 11C:
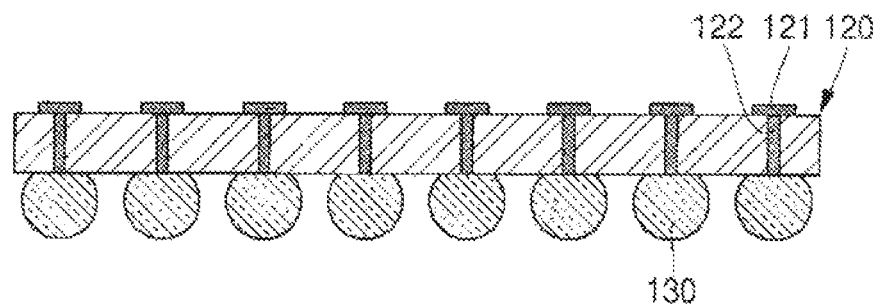

In the next step S2 of the fabrication process for the semiconductor device 100, the semiconductor die 120 is prepared. More particularly, as shown in FIG. 11B, the semiconductor die 120 is formed to include the aforementioned bond pads 121 on the top surface thereof, and the through-electrodes 122 which pass through the semiconductor die 120 between the top and bottom surfaces thereof, the electrodes 122 being electrically coupled to respective ones of the bond pads 121 as indicated above. Thereafter, as illustrated in FIG. 11C, step S3 is completed wherein the conductive bumps 130 are electrically connected to those ends of the through electrodes 122 opposite those ends electrically coupled to the bond pads 121. Thus, the electrodes 122 effectively electrically couple the bond pads 121 to respective ones of the conductive bumps 130.

Figure 11D:
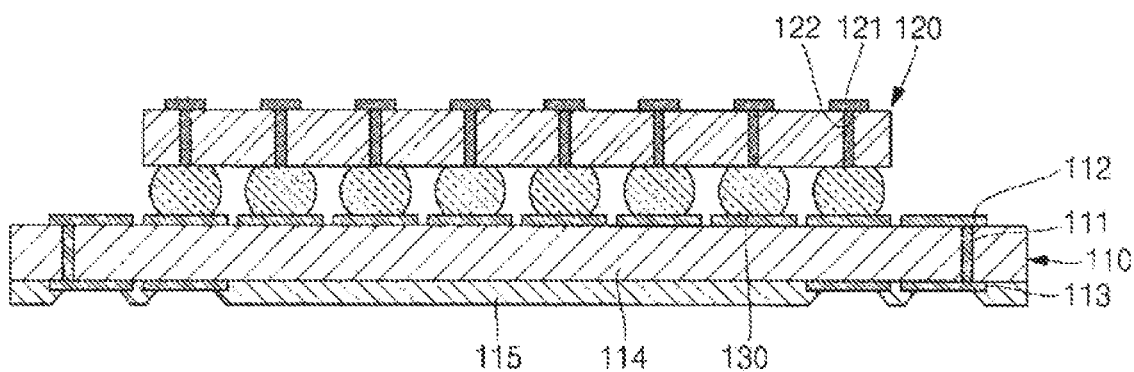

Referring now to FIG. 11D, in the next step S4 of the fabrication process for the semiconductor device 100, the semiconductor die 120 is electrically connected to the substrate 110. More particularly, the conductive bumps 130 electrically connected to the semiconductor die 120 as described above in relation to step S3 are each electrically connected to the conductive pattern 112 of the substrate 110. As also indicated above, an underfill material may be interposed between the semiconductor die 120 and the substrate 110, such underfill material thus covering or encapsulating at least portions of the conductive bumps 130.

Figure 11E:
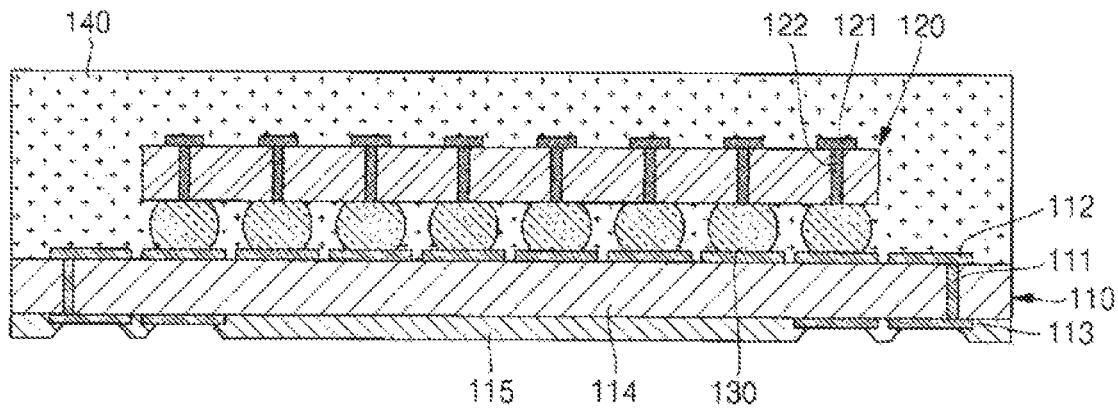

Referring now to FIG. 11E, in the next step S5 of the fabrication process for the semiconductor device 100, at least portions of the semiconductor die 120, the conductive bumps 130, the conductive pattern 112 and the top surface of the insulating layer 114 are each encapsulated or covered by an encapsulant material which ultimately hardens into the package body 140 of the semiconductor device 100. As indicated above, the fully formed package body 140 preferably includes a generally planar top surface, and generally planar side surfaces which extend in generally flush or co-planar relation to respective side surfaces of the insulating layer 114 of the substrate 110. The encapsulation step S5 can be carried out by transfer molding using a mold or dispensing molding using a dispenser.

Figure 11F:
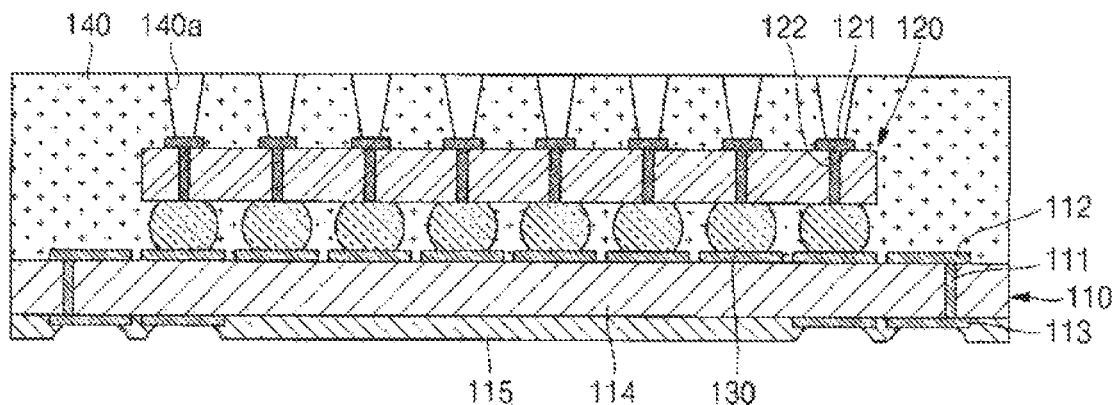
Figure 11G:
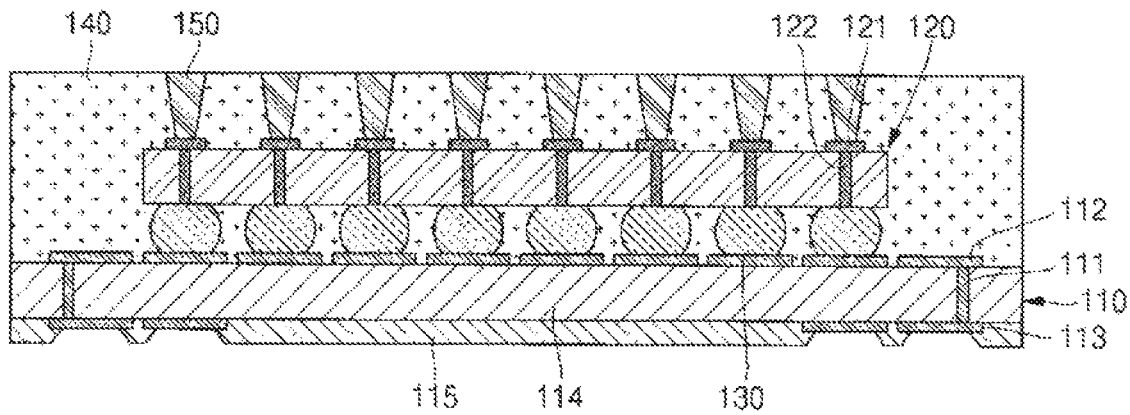

In the next step S6 of the fabrication process for the semiconductor device 100, the TMV's 150 are formed in the package body 140. More particularly, the formation of the TMV's 150 comprises the initial step of forming vias or holes 140a in the package body 140 as shown in FIG. 11F. Each of the holes 140a extends from the top surface of the package body 140 to a respective one of the bond pads 121. As indicated above, the holes 140a may be formed through the use of a laser drilling or chemical etching process. After being formed in the package body 140 in the aforementioned manner, each of the holes 140a is filled with a conductive metal material as shown in FIG. 11G, thus completing the formation of the TMV's 150. As also indicated above, the filling of each hole 140a with the metal material may be accomplished through the completion of a reflow process subsequent to the placement of a ball fabricated from a suitable conductive metal material upon that end of each hole 140 extending to the top surface of the package body 140.

Figure 11H:
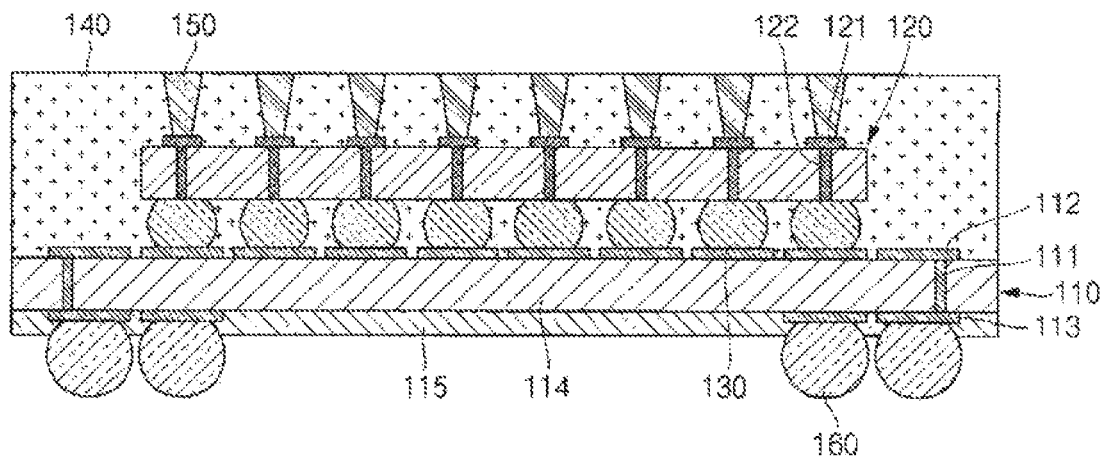

Referring now to FIG. 11H, in the next step S7 of the fabrication process for the semiconductor device 100, the solder balls 160 are electrically connected to respective ones of the lands 113 of the substrate 110. As seen in FIG. 11H, the solder mask 115 may extend into contact with the solder balls 160. The solder balls 160 may be fabricated from the materials described above in relation thereto.

Figure 2:
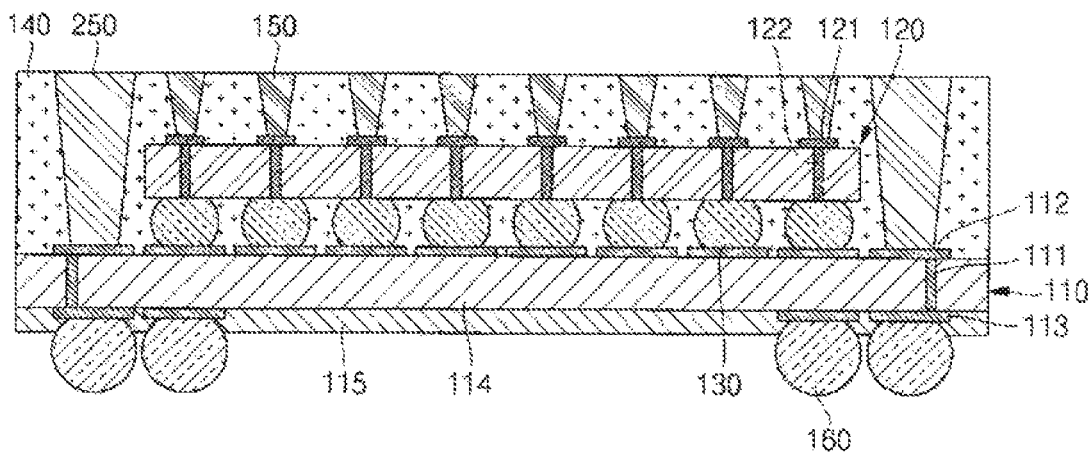
FIG. 2 is a cross-sectional view of a semiconductor device constructed in accordance with a second embodiment of the present invention.

Referring now to FIG. 2, there is shown a semiconductor device 200 constructed in accordance with a second embodiment of the present invention. The semiconductor device 200 is substantially similar to the above-described semiconductor device 100, with only the differences between the semiconductor devices 200, 100 being described below.

The sole distinction between the semiconductor devices 100, 200 lies in the addition of through-mold vias (TMV's) 250 to the package body 140 of the semiconductor device 200. As seen in FIG. 2, each of the TMV's 250 extends from the top surface of the package body 140 to a corresponding portion of the conductive pattern 112 of the substrate 110. Each TMV 250 is preferably fabricated using the same process described above in relation to each TMV 150. Advantageously, in the semiconductor device 200, the inclusion of the TMV's 250 increases the available number of input/output terminals of the semiconductor device 200 in comparison to the semiconductor device 100.

Figure 3:
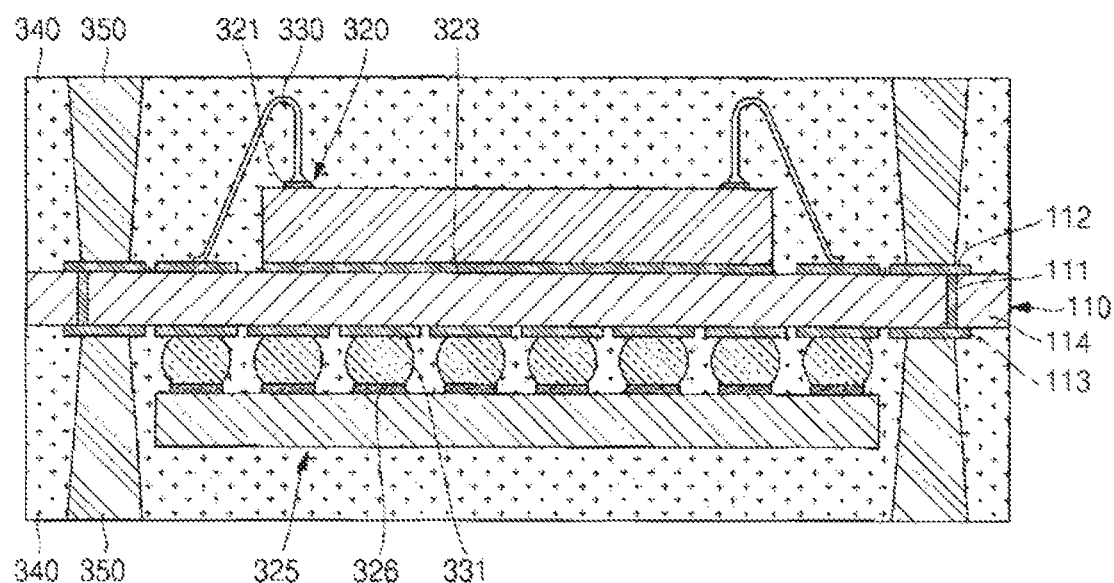
FIG. 3 is a cross-sectional view of a semiconductor device constructed in accordance with a third embodiment of the present invention.

Referring now to FIG. 3, there is shown a semiconductor device 300 constructed in accordance with a third embodiment of the present invention. The semiconductor device 300 comprises the above-described substrate 110. In addition to the substrate 110, the semiconductor device 300 comprises a first (upper) semiconductor die 320 which is attached to the top surface of the insulating layer 114 of the substrate 110 (as viewed from the perspective shown in FIG. 3) through the use of an adhesive layer 323. The first semiconductor die 320 defines opposed, generally planar top and bottom surfaces, and includes a plurality of terminals or bond pads 321 disposed on the top surface thereof. In this regard, the bottom surface of the first semiconductor die 320 is that surface which is attached to the substrate 110 through the use of the adhesive layer 323. In the semiconductor device 300, the bond pads 321 of the first semiconductor die 320 are electrically connected to the conductive pattern 112 of the substrate 110 through the use of a plurality of conductive wires 330. Each conductive wire 330 may be formed by the completion of a normal wire bonding method, that is, by forming a ball bond at the corresponding bond pad 321 of the first semiconductor die 320, and then forming a stitch bonding region at a prescribed portion of the conductive pattern 112 of the substrate 110. Alternatively, each conductive wire 330 may be formed by a reverse loop wire bonding method, that is, by forming a ball bond at the corresponding bond pad 321 and corresponding portion of the conductive pattern 112, and then connecting such ball bonds to each other.

In addition to the first semiconductor die 320, the semiconductor device 300 includes a second (lower) semiconductor die 325 which is also electrically connected to the substrate 110, and in particular the lands 113 thereof. Like the first semiconductor die 320, the second semiconductor die 325 defines opposed, generally planar top and bottom surfaces, and includes a plurality of bond pads 326 on that surface which defines the top surface as viewed from the perspective shown in FIG. 3. In this regard, each of the bond pads 326 of the second semiconductor die 325 is electrically connected to a respective one of the lands 113 through the use of respective ones of a plurality of conductive bumps 331. The conductive bumps 331 are each preferably fabricated from the same material described above in relation to the conductive bumps 130 of the semiconductor device 100.

In the semiconductor device 300, at least portions of the first and second semiconductor dies 320, 325, the conductive wires 330, the conductive bumps 331, the top and bottom surfaces of the insulating layer 114, the conductive pattern 112, and the lands 113 are each encapsulated or covered by an encapsulant material which ultimately hardens into a package body 340 of the semiconductor device 300. The package body 340 may be fabricated from the same material described above in relation to the package body 140 of the semiconductor device 100. As seen in FIG. 3, the fully formed package body 340 preferably includes a generally planar top surface when viewed from the perspective shown in FIG. 3, a generally planar bottom surface when viewed from the same perspective, and generally planar side surfaces which extend generally perpendicularly between the top and bottom surfaces in generally flush or co-planar relation to respective side surfaces of the insulating layer 114 of the substrate 110.

In the semiconductor device 300, the package body 340 includes a plurality of through-mold vias (TMV's) 350 disposed therein. As seen in FIG. 3, certain ones of the TMV's 350 extend from the top surface of the package body 340 to a corresponding portion of the conductive pattern 112 of the substrate 110. The remaining TMV's 350 extend from the bottom surface of the package body 340 to respective ones of the lands 113 of the substrate 110. Each TMV 350 is identically configured to the above-described TMV's 250 of the semiconductor device 200, and is preferably fabricated using the same process described above in relation to each TMV 150 of the semiconductor device 100. Along these lines, it is contemplated that the end of each TMV 350 extending to the top surface and/or the bottom surface of the package body 340 may have a generally concave configuration to partially accommodate solder balls of a conventional BGA semiconductor device which may be stacked on the top surface and/or the bottom surface of the semiconductor device 300. In this regard, the inclusion of the TMV's 350 in the semiconductor device 300 makes the semiconductor device 300 particularly suited for having one or more additional semiconductor devices stacked on the top and/or bottom surfaces thereof.

Figure 4:
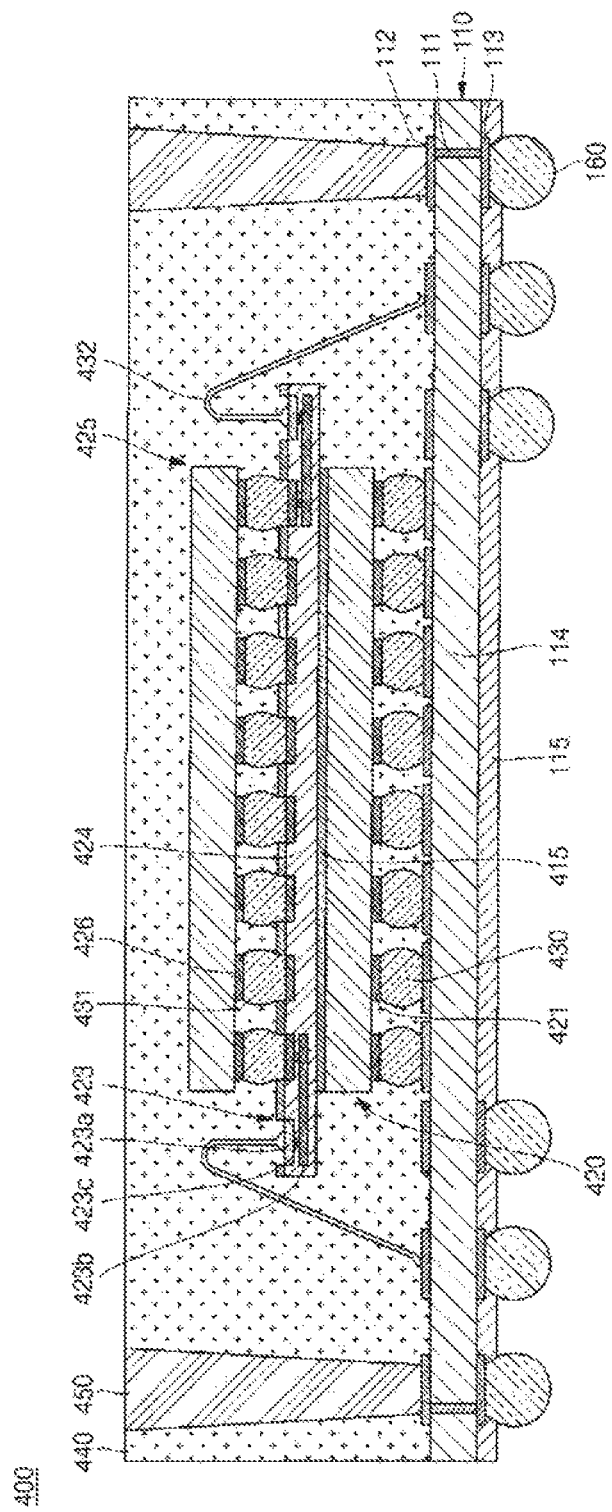
FIG. 4 is a cross-sectional view of a semiconductor device constructed in accordance with a fourth embodiment of the present invention.

Referring now to FIG. 4, there is shown a semiconductor device 400 constructed in accordance with a fourth embodiment of the present invention. The semiconductor device 400 comprises the above-described substrate 110. Additionally, in the semiconductor device 400, the above-described solder balls 160 are formed on and electrically connected to respective ones of the lands 113 of the substrate 110. Further, the above-described solder mask 115 is preferably applied to the bottom surface of the insulating layer 114 of the substrate 110, the solder mask 115 being coated on at least portions of the lands 113 and extending into contact with portions of each of the solder balls 160.

In addition to the substrate 110, the semiconductor device 400 comprises a first (lower) semiconductor die 320 which is electrically connected to the conductive pattern 112 of the substrate 110. More particularly, the first semiconductor die 420 defines opposed, generally planar top and bottom surfaces, and includes a plurality of terminals or bond pads 421 disposed on the bottom surface thereof. Each of the bond pads 421 is electrically connected to the conductive pattern 112 through the use of a respective one of a plurality of conductive bumps 430. The conductive bumps 430 are each preferably fabricated from the same material described above in relation to the conductive bumps 130 of the semiconductor device 100.

The semiconductor device 400 further comprises an interposer 423 which is attached to the top surface of the first semiconductor die 420 through the use of an adhesive layer 415. The interposer 423 includes an interposer body 424 having a first conductive pattern 423a formed within the top surface thereof, a second conductive pattern 423b formed therein, and a third conductive pattern 423c which is also formed therein and electrically connects the first and second conductive patterns 423a, 423b to each other. That surface of the body 424 disposed furthest from the first conductive pattern 423a is secured to the top surface of the first semiconductor die 420 through the use of the aforementioned adhesive layer 413. As seen in FIG. 4, the first and second conductive patterns 423a, 423b are formed within the body 424 of the interposer 423 so as to extend along respective ones of a spaced, generally parallel pair of planes. On the other hand, the third conductive pattern 423c is formed in a direction which extends generally perpendicularly between the planes along which respective ones of the first and second patterns 423a, 423b extend.

The semiconductor device 400 further comprises a second (upper) semiconductor die 425 which is electrically connected to the interposer 423, and in particular to the first conductive pattern 423a formed on the body 424 thereof. Like the first semiconductor die 420, the second semiconductor die 425 defines opposed, generally planar top and bottom surfaces. Disposed on the bottom surface of the first semiconductor die 425 is a plurality of conductive terminals or bond pads 426. The bond pads 426 are each electrically connected to the first conductive pattern 423a through the use of respective ones of a plurality of conductive bumps 431 which are each preferably fabricated from the same material used in relation to the conductive bumps 430. As seen in FIG. 4, the second and third conductive patterns 423b, 423c of the interposer 423 are configured to effectively route signals between a portion of the first conductive pattern 423a to which the second semiconductor die 425 is electrically connected to another portion of the first conductive pattern 423a which is located outwardly beyond the lateral side surfaces of the second semiconductor die 425. In this regard, when the interposer 423 is captured between the first and second semiconductor dies 420, 425 in the manner shown in FIG. 4, a peripheral portion of the interposer 423 protrudes beyond the lateral side surfaces of each of the first and second semiconductor dies 420, 425. Additionally, a portion of the first conductive pattern 423a is exposed in the body 424 of such peripheral portion of the interposer 423.

In the semiconductor device 400, the interposer 423 (and hence the second semiconductor die 425) is electrically connected to the conductive pattern 112 of the substrate 110 through the use of one or more electrically conductive wires 432. More particularly, one end of each conductive wire 432 extends and is electrically connected to a portion of the first conductive pattern 423a which is exposed in the peripheral portion of the substrate 423, and in particular the body 424 thereof. The remaining, opposite end of the conductive wire 432 is electrically connected to a prescribed portion of the conductive pattern 112 of the substrate 110. Thus, the second semiconductor die 425 is capable of receiving electrical signals from and outputting electrical signals to an external circuit via the interposer 423, conductive wire(s) 432, and substrate 110.

In the semiconductor device 400, at least portions of the first and second semiconductor dies 420, 425, the conductive bumps 430, 431, the interposer 423, the conductive wires 432, the insulating layer 114 of the substrate 110, and the conductive pattern 112 are each encapsulated or covered by an encapsulant material which ultimately hardens into a package body 440 of the semiconductor device 100. The package body 440 may be fabricated from the same materials described above in relation to the package body 140 of the semiconductor device 100. The fully formed package body 440 preferably includes a generally planar top surface, and generally planar side surfaces which extend in generally flush or co-planar relation to respective side surfaces of the insulating layer 114 of the substrate 110.

In the semiconductor device 400, the package body 440 preferably includes a plurality of through-mold vias (TMV's) 450 formed therein. As seen in FIG. 4, each of the TMV's 450 extends from the top surface of the package body 440 to a corresponding portion of the conductive pattern 112 of the substrate 110. Each TMV 450 is identically configured to the above-described TMV's 250, 350, and is preferably fabricated using the same process described above in relation to each TMV 150.

Figure 5:
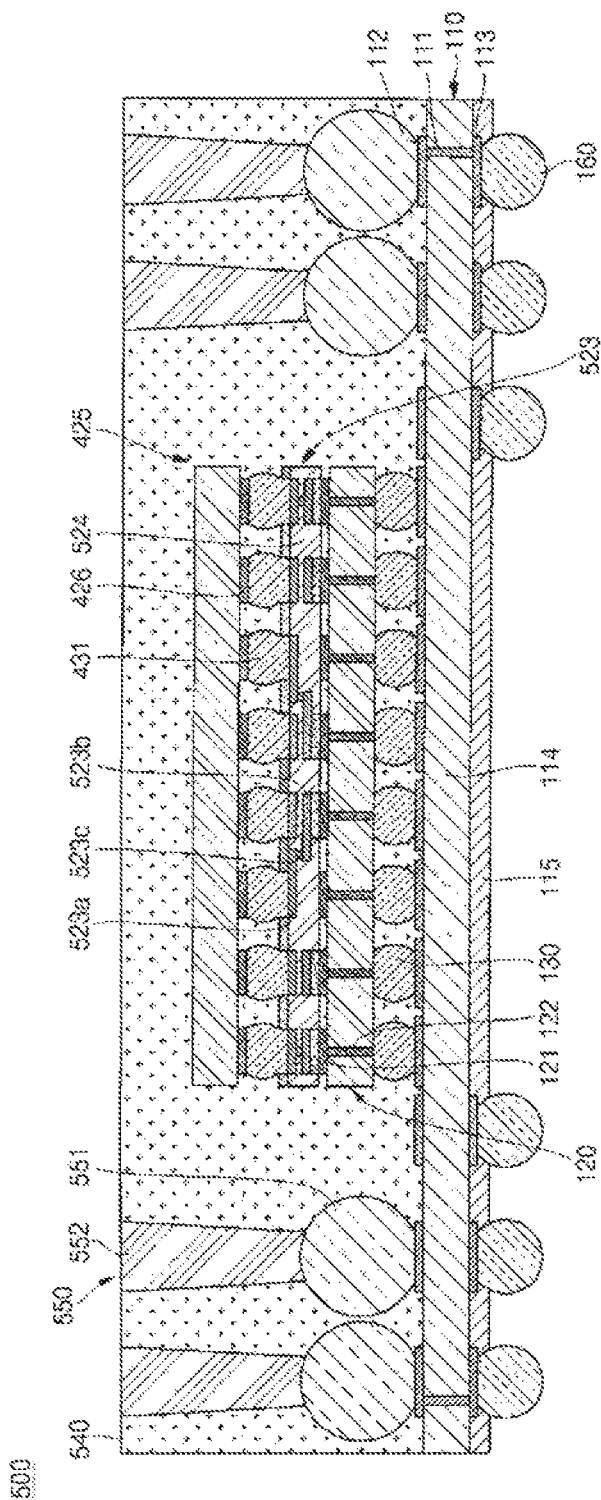
FIG. 5 is a cross-sectional view of a semiconductor device constructed in accordance with a fifth embodiment of the present invention.

Referring now to FIG. 5, there is shown a semiconductor device 500 constructed in accordance with a fifth embodiment of the present invention. The semiconductor device 500 comprises the above-described substrate 110. Additionally, in the semiconductor device 500, the above-described solder balls 160 are formed on and electrically connected to respective ones of the lands 113 of the substrate 110. Further, the above-described solder mask 115 is preferably applied to the bottom surface of the insulating layer 114 of the substrate 110, the solder mask 115 being coated on at least portions of the lands 113 and extending into contact with portions of each of the solder balls 160. The semiconductor device 500 also includes a first semiconductor die 120 which is identical to the above-described semiconductor 120 of the semiconductor device 100, and is electrically connected to the conductive pattern 112 of the substrate 110 through the use of the conductive bumps 130 in the same manner described above in relation to the semiconductor device 100. In addition to the first semiconductor die 120, also electrically connected to the conductive pattern 112 of the substrate 110 is a plurality of conductive balls 551. As seen in FIG. 5, the conductive balls 551 are electrically connected to a peripheral portion of the conductive pattern 112. Each of the conductive balls 551 is preferably fabricated from a conductive material selected from copper, aluminum, gold, silver, tin, lead, bismuth, soldering materials or equivalents thereto.

The semiconductor device 500 further comprises an interposer 523 which is disposed on the top surface of the first semiconductor die 420 and electrically connected to the first semiconductor die 120. The interposer 523 includes an interposer body 524 having a first conductive pattern 523a formed within the top surface thereof, a second conductive pattern 523b formed therein, and a third conductive pattern 523c which is also formed therein and electrically connects the first and second conductive patterns 523a, 523b to each other. As seen in FIG. 5, the first and second conductive patterns 523a, 523b are formed within the body 524 of the interposer 523 so as to extend along respective ones of a spaced, generally parallel pair of planes. On the other hand, the third conductive pattern 523c is formed in a direction which extends generally perpendicularly between the planes along which respective ones of the first and second conductive patterns 523a, 523b extend. In the semiconductor device 500, the second conductive pattern 523b of the interposer 523 is electrically connected to the bond pads 121 of the first semiconductor die 121. As is also seen in FIG. 5, the interposer 523 is sized relative to the first semiconductor die 120 such that the side surfaces of the body 524 extend in substantially co-planar relation to respective side surfaces of the first semiconductor die 120.

The semiconductor device 500 further comprises the second (upper) semiconductor die 425 described above in relation to the semiconductor device 400. In this regard, the second semiconductor die 425 is electrically connected to the interposer 523, and in particular to the first conductive pattern 523a formed on the body 524 thereof. The bond pads 426 of the second semiconductor die 425 are each electrically connected to the first conductive pattern 523a through the use of respective ones of the aforementioned conductive bumps 431. As seen in FIG. 5, the side surfaces of the body 524 of the interposer 523 also extend in substantially co-planar to respective side surfaces of the second semiconductor die 425. Thus, when the interposer 523 is captured between the first and second semiconductor dies 120, 425 in the manner shown in FIG. 5, the side surfaces of the body 524 of the interposer 523 extend in generally co-planar relation to respective ones of the lateral side surfaces of each of the first and second semiconductor dies 120, 425.

In the semiconductor device 500, at least portions of the first and second semiconductor dies 120, 425, the conductive bumps 130, 431, the interposer 523, the conductive balls 551, the insulating layer 114 of the substrate 110, and the conductive pattern 112 are each encapsulated or covered by an encapsulant material which ultimately hardens into a package body 540 of the semiconductor device 500. The package body 540 may be fabricated from the same materials described above in relation to the package body 140 of the semiconductor device 100. The fully formed package body 540 preferably includes a generally planar top surface, and generally planar side surfaces which extend in generally flush or co-planar relation to respective side surfaces of the insulating layer 114 of the substrate 110.

In the semiconductor device 500, the package body 140 preferably includes a plurality of through-mold vias (TMV's) 550 formed therein. Each TMV 550 includes a first region which is defined by a respective one of the conductive balls 551 electrically connected to the conductive pattern 112 of the substrate 110. In addition to the first region, each TMV 550 includes a second region 552 which extends from the top surface of the package body 140 to a respective one of the conductive balls 551. The second region 552 of each TMV 550 is identically configured to the above-described TMV's 250, 350, 450, and is preferably fabricated using the same process described above in relation to each TMV 150. In this regard, the second region 552 of each TMV 550 is defined by a metal-filled hole which is formed in the package body 540 to extend from the top surface thereof to a corresponding conductive ball 551 (i.e., the first region of the same TMV 550). Thus, each TMV 550 (comprising the second region 552 and the first region or conductive ball 551) extends from the top surface of the package body 540 to (and in electrical communication with) the conductive pattern 112. Since the second regions 552 of the TMV's 550 extend to respective ones of the conductive balls 551 rather than to the conductive pattern 112, each second region 552 is of a shorter height in comparison to the TMV's 450 included in the semiconductor device 400, though being fabricated in the same manner as indicated above. Due to the shortened height of height of the second regions 552 of the TMV's 550, including the holes used to form the same, potential adverse effects on the first and second semiconductor dies 120, 425 attributable to the formation of the holes is reduced, thus improving the reliability of the semiconductor device 500.

Figure 6:
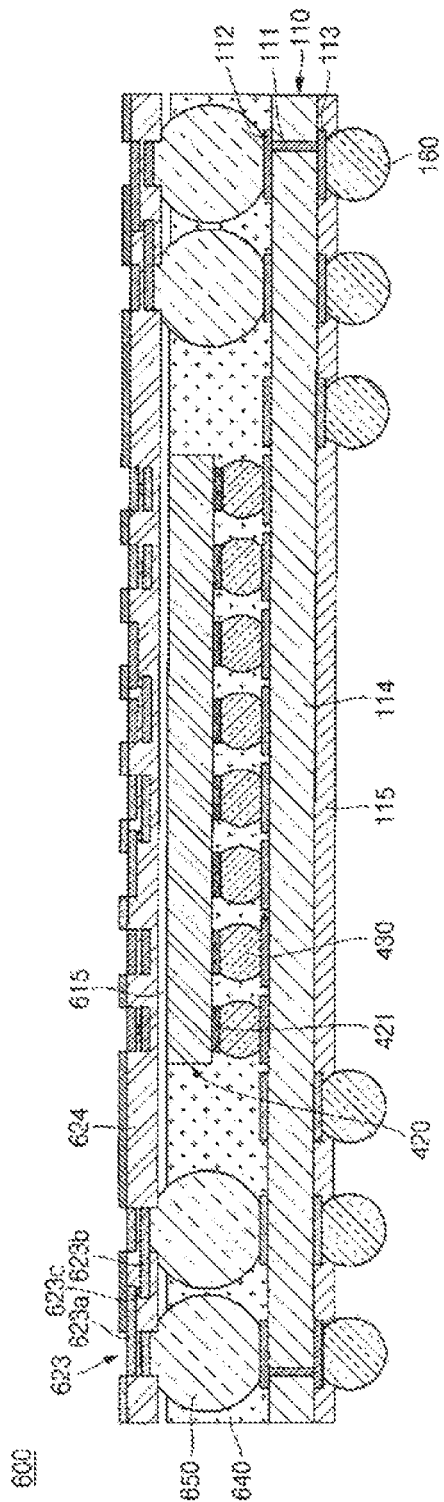
FIG. 6 is a cross-sectional view of a semiconductor device constructed in accordance with a sixth embodiment of the present invention.

Referring now to FIG. 6, there is shown a semiconductor device 600 constructed in accordance with a sixth embodiment of the present invention. The semiconductor device 600 comprises the above-described substrate 110. Additionally, in the semiconductor device 600, the above-described solder balls 160 are formed on and electrically connected to respective ones of the lands 113 of the substrate 110. Further, the above-described solder mask 115 is preferably applied to the bottom surface of the insulating layer 114 of the substrate 110, the solder mask 115 being coated on at least portions of the lands 113 and extending into contact with portions of each of the solder balls 160. The semiconductor device 600 also includes a semiconductor die 420 which is identical to the above-described semiconductor 420 of the semiconductor device 400, and is electrically connected to the conductive pattern 112 of the substrate 110 through the use of the conductive bumps 430 in the same manner described above in relation to the semiconductor device 400.

In the semiconductor device 600, at least portions of the semiconductor die 420, the conductive bumps 430, the insulating layer 114 of the substrate 110, and the conductive pattern 112 are each encapsulated or covered by an encapsulant material which ultimately hardens into a package body 640 of the semiconductor device 600. The package body 640 may be fabricated from the same materials described above in relation to the package body 140 of the semiconductor device 100. The fully formed package body 640 preferably includes a generally planar top surface, and generally planar side surfaces which extend in generally flush or co-planar relation to respective side surfaces of the insulating layer 114 of the substrate 110. The generally planar top surface of the semiconductor die 420 is preferably exposed in and substantially flush with the top surface of the package body 640.

In the semiconductor device 600, the package body 640 preferably includes a plurality of through-mold vias (TMV's) 650 formed therein. Each TMV 650 preferably comprises a conductive ball which is electrically connected to a peripheral portion of the conductive pattern 112. The conductive balls used to define the TMV's 650 are preferably fabricated from a conductive material selected from copper, aluminum, gold, silver, tin, lead, bismuth, soldering materials or equivalents thereto. Importantly, in the semiconductor device 600, the package body 640 is formed in a manner wherein portions of the conductive balls used to form the TMV's 650 protrude from the top surface of the package body 640 in the manner shown in FIG. 6. Thus, the height of each TMV 650 slightly exceeds the height or thickness of the package body 640. It is also contemplated that the package body 640 may be fabricated by attaching a mold film to the substrate 110, such mold film partially covering the semiconductor die 420 and TMV's 650 in the aforementioned manner.

The semiconductor device 600 further comprises an interposer 623 which is disposed on and electrically connected to the TMV's 650. The interposer 623 includes an interposer body 624 having a first conductive pattern 623a formed within the top surface thereof, a second conductive pattern 623b formed therein, and a third conductive pattern 623c which is also formed therein and electrically connects the first and second conductive patterns 623a, 623b to each other. As seen in FIG. 6, the first and second conductive patterns 623a, 623b are formed within the body 624 of the interposer 623 so as to extend along respective ones of a spaced, generally parallel pair of planes. On the other hand, the third conductive pattern 623c is formed in a direction which extends generally perpendicularly between the planes along which respective ones of the first and second conductive patterns 623a, 623b extend. In the semiconductor device 600, the second conductive pattern 623b of the interposer 623 is electrically connected to the exposed portions of the TMV's 650 in the manner shown in FIG. 6. Due to those portions of the TMV's 650 to which the interposer 623 is electrically connected protruding above the top surface of the package body 640, a narrow space or gap 615 is defined between the top surface of the package body 640 (as well as the top surface of the semiconductor die 420) and the interposer 623 (i.e., the bottom surface of the body 624). The formation of the gap 615 between the package body 640 and the interposer 623 enhances the ability of the semiconductor die 420 to dissipate heat outside of the semiconductor device 600. Advantageously, the inclusion of the interposer 623 in the semiconductor device 600 allows a wiring pattern of the TMV's 650 to be selectively redistributed using the interposer 623. As is also seen in FIG. 6, the interposer 623 is sized relative to the package body 640 such that the side surfaces of the body 624 extend in substantially co-planar relation to respective side surfaces of the package body 640.

Figure 12:
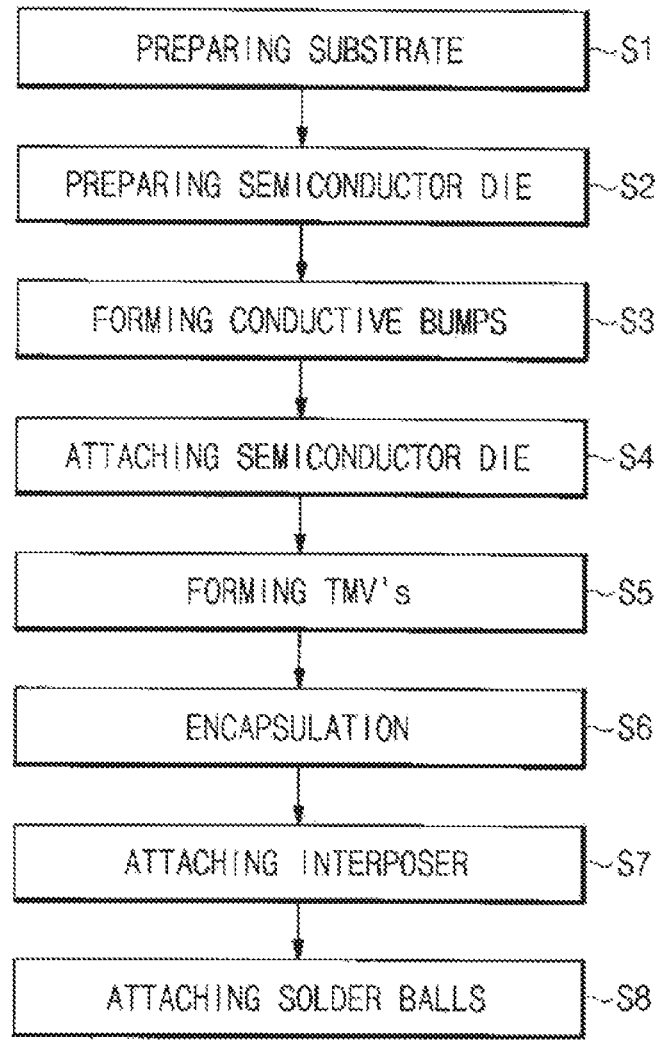
FIG. 12 is a flow chart illustrating an exemplary fabrication method for the semiconductor device shown in FIG. 6.

Referring now to FIG. 12, there is provided a flow chart which sets forth an exemplary method for fabricating the semiconductor device 600 of the present invention shown in FIG. 6. The method comprises the steps of preparing the substrate (S1), preparing the semiconductor die (S2), forming conductive bumps on the semiconductor die (S3), attaching and electrically connecting the semiconductor die to the substrate (S4), forming TMV's on the substrate (S5), encapsulation to form a package body (S6), attaching an interposer to the TMV's (S7), and the connection of solder balls to the substrate (S8). FIGS. 13A-13H provide illustrations corresponding to these particular steps, as will be discussed in more detail below.

Figure 13A:
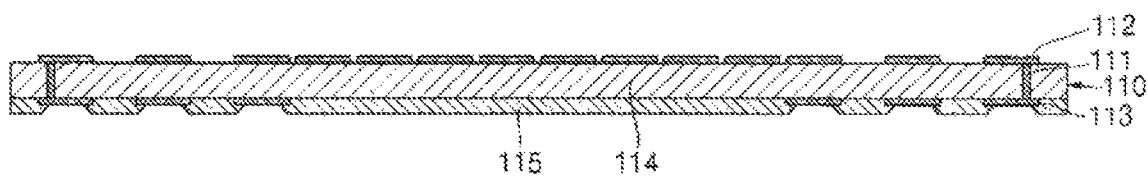
FIGS. 13A, 13B, 13C, 13D, 13E, 13F, 13G, and 13H are views illustrating an exemplary fabrication method for the semiconductor package shown in FIG. 6.

Referring now to FIG. 13A, in the initial step S1 of the fabrication process for the semiconductor device 600, the substrate 110 having the above-described structural attributes is provided. As indicated above, a solder mask 115 may be coated on at least portions of the lands 113 and the bottom surface of the insulating layer 114.

Figure 13B:
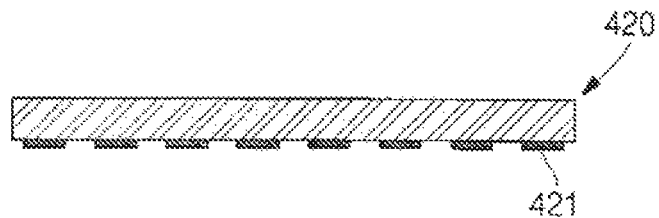
Figure 13C:
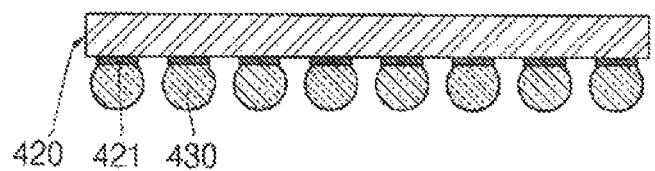

In the next step S2 of the fabrication process for the semiconductor device 600, the semiconductor die 420 is prepared. More particularly, as shown in FIG. 13B, the semiconductor die 420 is formed to include the aforementioned bond pads 421 on the bottom surface thereof. As shown in FIG. 13B, the bond pads 421 are formed on the bottom surface of the semiconductor die 420 so as to protrude therefrom. In this regard, those of ordinary skill in the art will recognize that the bond pads 421 may alternatively be formed so as to be at least partially embedded in the semiconductor die 420 and to extend in substantially flush relation to the bottom surface thereof. Thereafter, as illustrated in FIG. 13C, step S3 is completed wherein the conductive bumps 430 are electrically connected to respective ones of the bond pads 121.

Figure 13D:
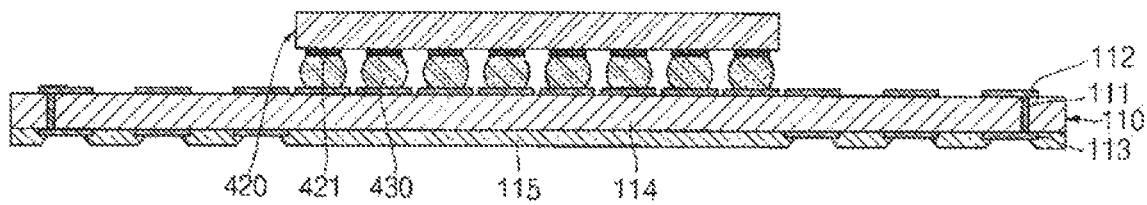

Referring now to FIG. 13D, in the next step S4 of the fabrication process for the semiconductor device 600, the semiconductor die 420 is electrically connected to the substrate 110. More particularly, the conductive bumps 430 electrically connected to the semiconductor die 420 as described above in relation to step S3 are each electrically connected to the conductive pattern 112 of the substrate 110, and hence to the lands 113.

Figure 13E:
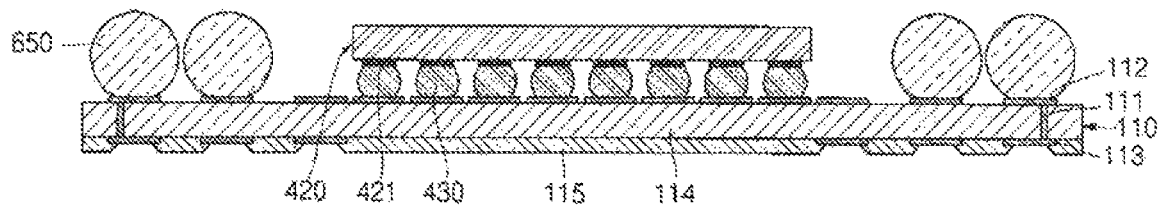

Referring now to FIG. 13E, in the next step S5 of the fabrication process for the semiconductor device 600, the TMV's 650 are formed on the substrate 110. More particularly, as explained above, the formation of the TMV's 650 is facilitated by forming the aforementioned conductive balls on respective peripheral portions of the conductive pattern 112 of the substrate 110. Thus, the TMV's 650 extend at least partially about the periphery of the semiconductor die 420 in the manner shown in FIG. 13E.

Figure 13F:
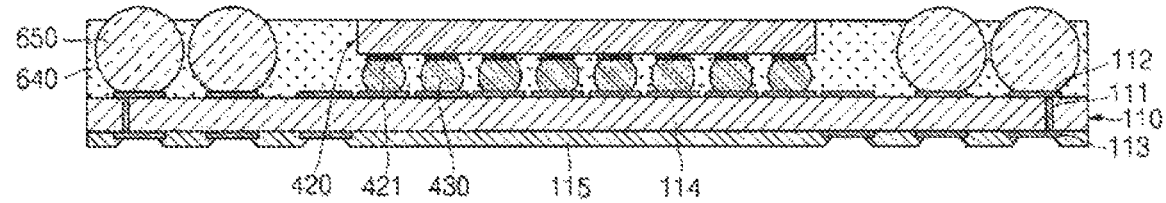

Referring now to FIG. 13F, in the next step S6 of the fabrication process for the semiconductor device 600, at least portions of the semiconductor die 420, the conductive bumps 430, the TMV's 650, the conductive pattern 112 and the top surface of the insulating layer 114 are each encapsulated or covered by an encapsulant material which ultimately hardens into the package body 640 of the semiconductor device 600. As indicated above, the fully formed package body 640 preferably includes a generally planar top surface, and generally planar side surfaces which extend in generally flush or co-planar relation to respective side surfaces of the insulating layer 114 of the substrate 110. As also indicated above, the package body 640 is formed such that the top surface of the semiconductor die 420 extends in substantially flush relation to the top surface of the package body, with the TMV's 650 protruding slightly beyond the top surface of the package body 640. The encapsulation step S6 can be carried out by transfer molding using a mold, dispensing molding using a dispenser, or through the use of the aforementioned mold film.

Figure 13G:
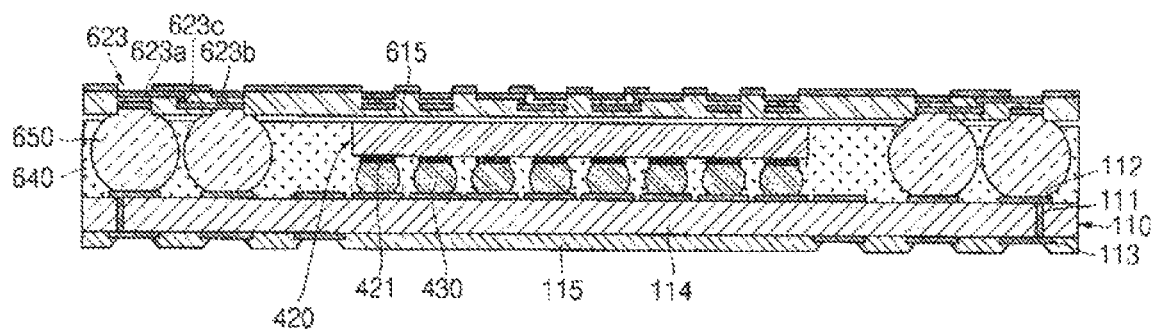

In the next step S7 of the fabrication process for the semiconductor device 600 shown in FIG. 13G, the interposer 623 is electrically connected to the TMV's 650. More particularly, the second conductive pattern 623b of the interposer 623 is electrically connected to the exposed portions of the TMV's 650 such that the aforementioned gap 615 is defined between the bottom surface of the body 624 of the interposer 623 and the top surface of the package body 640.

Figure 13H:
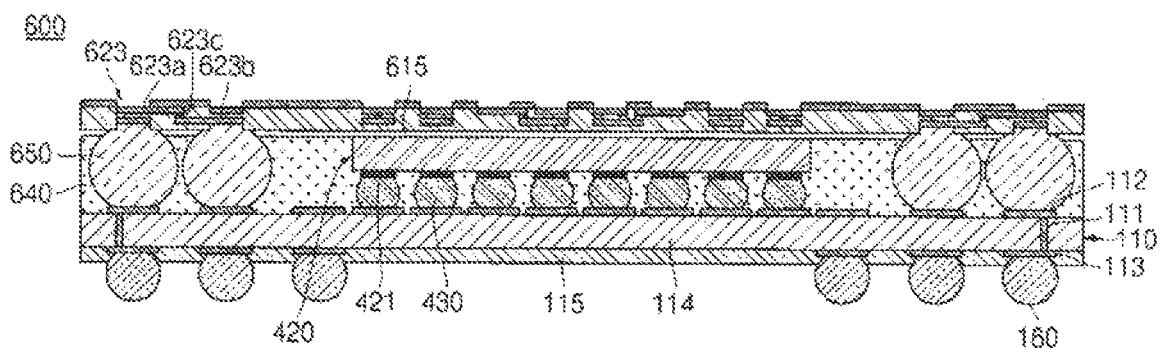

Referring now to FIG. 13H, in the next step S8 of the fabrication process for the semiconductor device 600, the solder balls 160 are electrically connected to respective ones of the lands 113 of the substrate 110. As seen in FIG. 13H, the solder mask 115 may extend into contact with the solder balls 160. The solder balls 160 may be fabricated from the materials described above in relation thereto.

Figure 7:
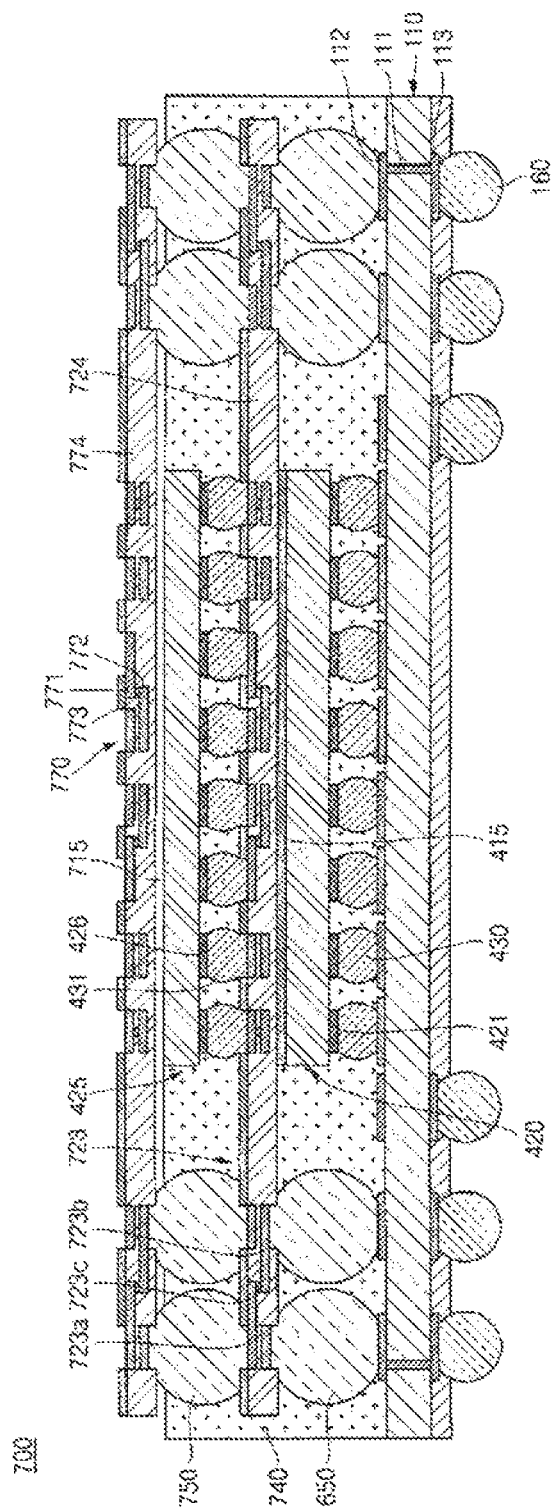
FIG. 7 is a cross-sectional view of a semiconductor device constructed in accordance with a seventh embodiment of the present invention.

Referring now to FIG. 7, there is shown a semiconductor device 700 constructed in accordance with a seventh embodiment of the present invention. The semiconductor device 700 comprises the above-described substrate 110. Additionally, in the semiconductor device 700, the above-described solder balls 160 are formed on and electrically connected to respective ones of the lands 113 of the substrate 110. Further, the above-described solder mask 115 is preferably applied to the bottom surface of the insulating layer 114 of the substrate 110, the solder mask 115 being coated on at least portions of the lands 113 and extending into contact with portions of each of the solder balls 160. The semiconductor device 700 also includes a first (lower) semiconductor die 420 which is identical to the above-described semiconductor 420 of the semiconductor device 400, and is electrically connected to the conductive pattern 112 of the substrate 110 through the use of the conductive bumps 430 in the same manner described above in relation to the semiconductor device 400.

In the semiconductor device 700, a plurality of conductive balls (which ultimately define lower through-mold vias or TMV's 650 as described below) are electrically connected to a peripheral portion of the first conductive pattern 112. The conductive balls used to define the TMV's 650 are preferably fabricated from a conductive material selected from copper, aluminum, gold, silver, tin, lead, bismuth, soldering materials or equivalents thereto.

The semiconductor device 700 further comprises a first (lower) interposer 723 which is disposed on and electrically connected to the conductive balls ultimately defining the TMV's 650. The first interposer 723 includes an interposer body 724 having a first conductive pattern 723a formed within the top surface thereof, a second conductive pattern 723b formed therein, and a third conductive pattern 723c which is also formed therein and electrically connects the first and second conductive patterns 723a, 723b to each other. As seen in FIG. 7, the first and second conductive patterns 723a, 723b are formed within the body 724 of the first interposer 723 so as to extend along respective ones of a spaced, generally parallel pair of planes. On the other hand, the third conductive pattern 723c is formed in a direction which extends generally perpendicularly between the planes along which respective ones of the first and second conductive patterns 723a, 723b extend. In the semiconductor device 700, the second conductive pattern 723b of the first interposer 723 is electrically connected to the conductive balls ultimately defining the TMV's 650 in the manner shown in FIG. 7. Additionally, the first interposer 723, and in particular a central portion of the bottom surface of the body 724 thereof, is attached to the top surface of the first semiconductor die through the use of an adhesive layer 415.

The semiconductor device 700 also includes a second (upper) semiconductor die 425 which is identical to the above-described semiconductor 425 of the semiconductor device 400, and is electrically connected to a central portion of the first conductive pattern 723a of the first interposer 723 through the use of the conductive bumps 431 in the same manner described above in relation to electrical connection of the second semiconductor die 425 of the semiconductor device 400 to the first conductive pattern 423a of the interposer 423 thereof. In the semiconductor device 700, a plurality of conductive balls (which ultimately define upper through-mold vias or TMV's 750 as described below) are electrically connected to a peripheral portion of the first conductive pattern 723a of the first interposer 723. The conductive balls used to define the TMV's 750 are also preferably fabricated from a conductive material selected from copper, aluminum, gold, silver, tin, lead, bismuth, soldering materials or equivalents thereto.

In the semiconductor device 700, at least portions of the first and second semiconductor dies 420, 425, the first interposer 723, the conductive bumps 430, the conductive balls ultimately defining the TMV's 650, 750, the insulating layer 114 of the substrate 110, and the conductive pattern 112 are each encapsulated or covered by an encapsulant material which ultimately hardens into a package body 740 of the semiconductor device 700. The package body 740 may be fabricated from the same materials described above in relation to the package body 140 of the semiconductor device 100. The fully formed package body 740 preferably includes a generally planar top surface, and generally planar side surfaces which extend in generally flush or co-planar relation to respective side surfaces of the insulating layer 114 of the substrate 110. The generally planar top surface of the second semiconductor die 425 is preferably exposed in and substantially flush with the top surface of the package body 740.

In the semiconductor device 700, the TMVs 650 are defined by the encapsulation of the conductive balls electrically connected to and extending between the conductive pattern 112 of the substrate 110 and the second conductive pattern 723b of the interposer 723. Similarly, the upper TMVs 750 are defined by the partial encapsulation of the conductive balls electrically connected to the first conductive pattern 723a of the interposer 723 with the package body 740. Importantly, in the semiconductor device 700, the package body 740 is formed in a manner wherein portions of the conductive balls used to form the TMV's 750 protrude from the top surface of the package body 740 in the manner shown in FIG. 7. Thus, the height of each TMV 750 slightly exceeds the height or thickness of the package body 740. As indicated above, each TMV 650, 750 preferably comprises a respective one of the aforementioned conductive balls which are each electrically connected to a peripheral portion of the first interposer 723.

The semiconductor device 700 further comprises a second (upper) interposer 770 which is disposed on and electrically connected to the TMV's 750. The second interposer 770 includes an interposer body 774 having a first conductive pattern 771 formed within the top surface thereof, a second conductive pattern 772 formed therein, and a third conductive pattern 773 which is also formed therein and electrically connects the first and second conductive patterns 771, 772 to each other. As seen in FIG. 7, the first and second conductive patterns 771, 772 are formed within the body 774 of the second interposer 770 so as to extend along respective ones of a spaced, generally parallel pair of planes. On the other hand, the third conductive pattern 773 is formed in a direction which extends generally perpendicularly between the planes along which respective ones of the first and second conductive patterns 771, 772 extend. In the semiconductor device 700, the second conductive pattern 772 of the second interposer 770 is electrically connected to the exposed portions of the TMV's 750 in the manner shown in FIG. 7. Due to those portions of the TMV's 750 to which the second interposer 770 is electrically connected protruding above the top surface of the package body 740, a narrow space or gap 715 is defined between the top surface of the package body 740 (as well as the top surface of the second semiconductor die 425) and the second interposer 770 (i.e., the bottom surface of the body 774). The formation of the gap 715 between the package body 740 and the second interposer 770 enhances the ability of the second semiconductor die 425 to dissipate heat outside of the semiconductor device 700. Advantageously, the inclusion of the second interposer 770 in the semiconductor device 700 allows a wiring pattern of the TMV's 750 to be selectively redistributed using the interposer 770.

Figure 8:
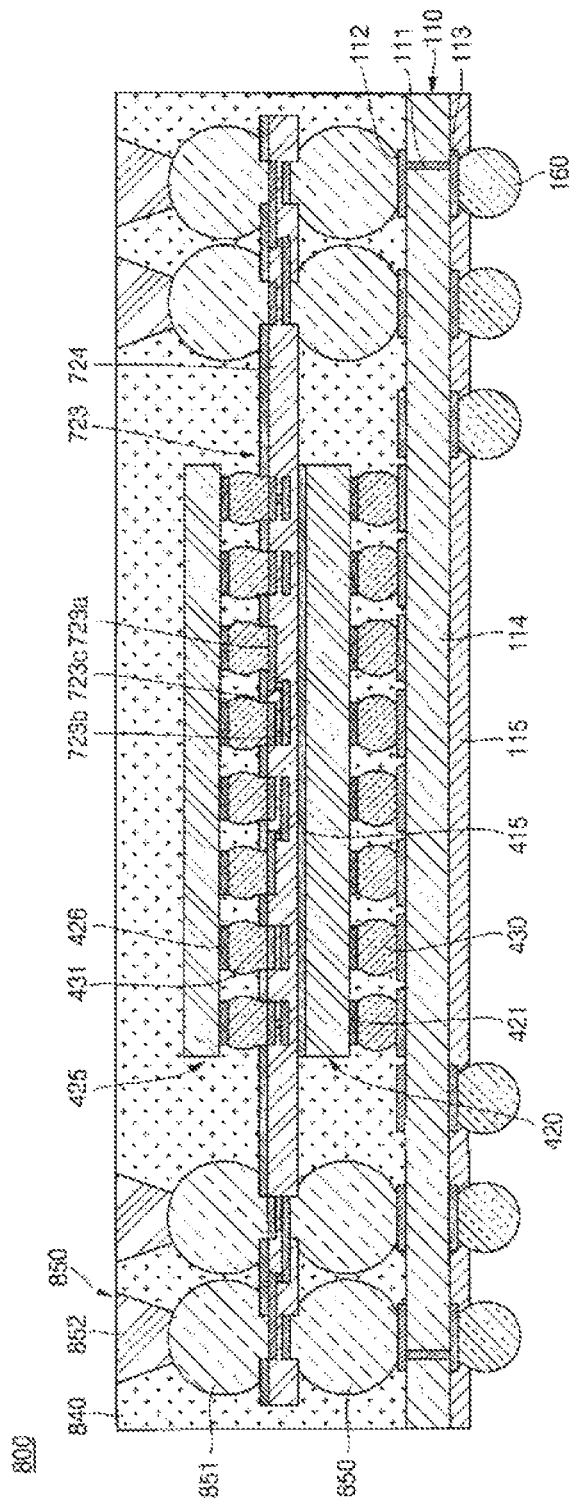
FIG. 8 is a cross-sectional view of a semiconductor device constructed in accordance with an eighth embodiment of the present invention.

Referring now to FIG. 8, there is shown a semiconductor device 800 constructed in accordance with an eighth embodiment of the present invention. The semiconductor device 800 is substantially similar to the above-described semiconductor device 700, with only the differences between the semiconductor devices 800, 700 being described below.

One of the differences between the semiconductor devices 800, 700 lies in the omission of the above-described second interposer 770 in the semiconductor device 800. Additionally, in the semiconductor device 800, the package body 740 described above in relation to the semiconductor device 700 is substituted with the package body 840 which is formed to completely cover the top surface of the second semiconductor die 425. This is in contrast to the semiconductor device 700 wherein the top surface of the second semiconductor die 425 is exposed in the top surface of the package body 740.

Another distinction between the semiconductor devices 800, 700 lies in the substitution of the above-described TMV's 750 of the semiconductor device 700 with the TMV's 850 included in the semiconductor device 800. In this regard, each of the TMV's 850 bears substantial structural similarity to the TMV's 550 described above in relation to the semiconductor device 500. More particularly, as seen in FIG. 8, each TMV 850 includes a first region which is defined by a respective one of a plurality of conductive balls 851 which are each electrically connected to a peripheral portion of the first conductive pattern 723a of the interposer 723. In addition to the first region, each TMV 850 includes a second region 852 which extends from the top surface of the package body 840 to a respective one of the conductive balls 851. The second region 852 of each TMV 850 is identically configured to the above-described TMV's 250, 350, 450, 550, and is preferably fabricated using the same process described above in relation to each TMV 150. In this regard, the second region 852 of each TMV 850 is defined by a metal-filled hole which is formed in the package body 840 to extend from the top surface thereof to a corresponding conductive ball 851 (i.e., the first region of the same TMV 850). Thus, each TMV 850 (comprising the second region 852 and the first region or conductive ball 851) extends from the top surface of the package body 840 to (and in electrical communication with) the first conductive pattern 723a of the interposer 723.

Figure 9:
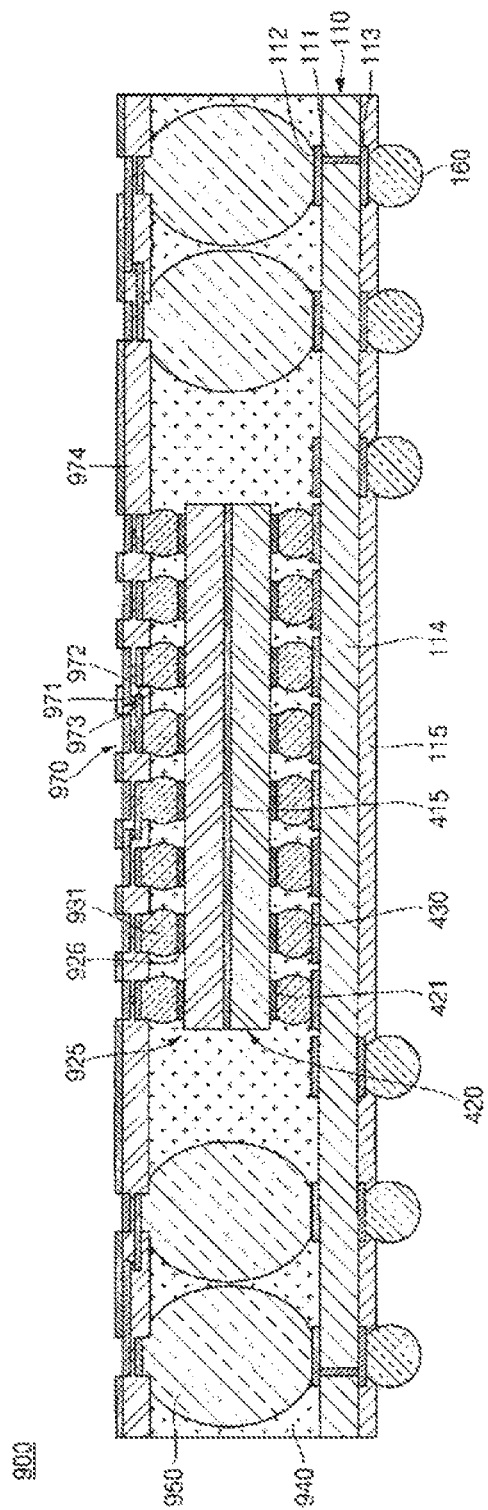
FIG. 9 is a cross-sectional view of a semiconductor device constructed in accordance with a ninth embodiment of the present invention.

Referring now to FIG. 9, there is shown a semiconductor device 900 constructed in accordance with a ninth embodiment of the present invention. The semiconductor device 900 comprises the above-described substrate 110. Additionally, in the semiconductor device 900, the above-described solder balls 160 are formed on and electrically connected to respective ones of the lands 113 of the substrate 110. Further, the above-described solder mask 115 is preferably applied to the bottom surface of the insulating layer 114 of the substrate 110, the solder mask 115 being coated on at least portions of the lands 113 and extending into contact with portions of each of the solder balls 160. The semiconductor device 900 also includes a first (lower) semiconductor die 420 which is identical to the above-described semiconductor die 420 of the semiconductor device 400, and is electrically connected to the conductive pattern 112 of the substrate 110 through the use of the conductive bumps 430 in the same manner described above in relation to the semiconductor device 400.

The semiconductor device 900 further comprises a second (upper) semiconductor die 925. The second semiconductor die 925 defines opposed, generally planar top and bottom surfaces, and includes a plurality of conductive terminals or bond pads 926 disposed on the top surface thereof when viewed from the perspective shown in FIG. 9. The bottom surface of the second semiconductor die 925 is attached to the top surface of the first semiconductor die 420 through the use of an intervening adhesive layer 415. The first and second semiconductor dies 420, 925 are preferably sized relative to each other such that the side surfaces thereof extend in substantially flush relation to each other when the first and second semiconductor dies 420, 925 are attached to each other through the use of the adhesive layer 415. Formed on and electrically connected to each of the bond pads 926 is a respective one of a plurality of conductive bumps 931, each of which is preferably fabricated from the same material used to facilitate the fabrication of conductive bumps 430 used to electrically connect the first semiconductor die 420 to the conductive pattern 112 of the substrate 110.

In the semiconductor device 900, at least portions of the first and second semiconductor dies 420, 925, the conductive bumps 430, 931, the insulating layer 114 of the substrate 110 and the conductive pattern 112 are each encapsulated or covered by an encapsulant material which ultimately hardens into a package body 940 of the semiconductor device 900. The package body 940 may be fabricated from the same materials described above in relation to the package body 140 of the semiconductor device 100. The fully formed package body 940 preferably includes a generally planar top surface, and generally planar side surfaces which extend in substantially flush or co-planar relation to respective side surfaces of the insulating layer 114 of the substrate 110. As seen in FIG. 9, portions of each of the conductive bumps 931 preferably protrude from the top surface of the package body 940.

In the semiconductor device 900, the package body 940 preferably includes a plurality of through-mold vias (TMV's) 950 formed therein. Each TMV 950 preferably comprises a conductive ball which is electrically connected to a peripheral portion of the conductive pattern 112. The conductive balls used to define the TMV's 950 are preferably fabricated from a conductive material selected from copper, aluminum, gold, silver, tin, lead, bismuth, soldering materials or equivalents thereto. Importantly, in the semiconductor device 900, the package body 940 is formed in a manner wherein portions of the conductive balls used to form the TMV's 950 protrude from the top surface of the package body 940 in the manner shown in FIG. 9. Thus, the height of each TMV 950 slightly exceeds the height or thickness of the package body 940.

The semiconductor device 900 further comprises an interposer 970 which is disposed on and electrically connected to the conductive bumps 931 and the TMV's 950. The interposer 970 includes an interposer body 974 having a first conductive pattern 971 formed within the top surface thereof, a second conductive pattern 972 formed therein, and a third conductive pattern 973 which is also formed therein and electrically connects the first and second conductive patterns 971, 972 to each other. As seen in FIG. 9, the first and second conductive patterns 971, 972 are formed within the body 974 of the interposer 623 so as to extend along respective ones of a spaced, generally parallel pair of planes. On the other hand, the third conductive pattern 973 is formed in a direction which extends generally perpendicularly between the planes along which respective ones of the first and second conductive patterns 971, 972 extend. In the semiconductor device 900, the second conductive pattern 972 of the interposer 970 is electrically connected to the exposed portions of the conductive bumps 931 and the TMV's 950 in the manner shown in FIG. 9. However, no space or gap such as the aforementioned gaps 615, 715 is defined between the interposer 970 and the top surface of the package body 940. Rather, the interposer 970, and in particular the bottom surface of the body 974 thereof, is in direct contact with the top surface of the package body 940. Advantageously, the inclusion of the interposer 970 in the semiconductor device 900 allows a wiring pattern of the conductive bumps 931 and the TMV's 950 to be selectively redistributed using the interposer 970. As is also seen in FIG. 9, the interposer 970 is sized relative to the package body 940 such that the side surfaces of the body 974 extend in substantially co-planar relation to respective side surfaces of the package body 940.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device, comprising:
a substrate having a top major surface and a bottom major surface opposite to the top major surface;
an electrically conductive pattern adjoining the top major surface;
conductive lands adjoining the bottom major surface and including a first conductive land, a second conductive land, a third conductive land, and a fourth conductive land;
conductive vias within the substrate and connecting part of the electrically conductive pattern to the conductive lands, the conductive vias including a first conductive via having a first width in a cross-sectional view and connected to the third conductive land;
conductive bumps;
a first semiconductor die mounted to the first conductive land and the second conductive land with the conductive bumps;
an electronic component electrically connected to the electrically conductive pattern of the substrate and mounted on the top major surface of the substrate;
a first package body encapsulating the first semiconductor die and comprising a bottom exterior surface distal to the bottom major surface of the substrate;
a second package body encapsulating the electronic component;
a first electrically conductive path physically and electrically connected to the third conductive land and extending to the bottom exterior surface of the first package body having a second width in the cross-sectional view that is greater than the first width; and
a second electrically conductive path physically and electrically connected to the fourth conductive land and extending to the bottom exterior surface of the first package body, wherein:
the first electrically conductive path comprises a first outer surface exposed from the bottom exterior surface of the first package body and configured as a first external electrical interconnect structure; and
the second electrically conductive path comprises a second outer surface exposed from the bottom exterior surface of the first package body and configured as a second external electrical interconnect structure.

2. The semiconductor device of claim 1, wherein:
the first conductive via is laterally offset with respect to the first electrically conductive path in the cross-sectional view;
the electrically conductive pattern comprises portions that laterally overlap onto the top major surface of the substrate;
the first electrically conductive path comprises a first conductive via;
the second electrically conductive path comprises a second conductive via; and
the first outer surface and the second outer surface are adapted for receiving a conductive solder structure.

3. The semiconductor device of claim 1, further comprising:
a bond pad on the electronic component; and
a conductive interconnect;
wherein:
the conductive interconnect directly connects the bond pad to the electrically conductive pattern;
the second package body encapsulates the conductive interconnect;
the second package body contacts the bond pad;
the first electrically conductive path comprises a first reflowed conductive ball; and
the second electrically conductive path comprises a second reflowed conductive ball.

4. The semiconductor device of claim 1, wherein:
the first semiconductor die comprises a first side, a second side opposite to the first side, and a first bond pad over the first side;
the conductive bumps comprise solder;
a first conductive bump of the conductive bumps directly mounts the first bond pad to the first conductive land;
the first package body contacts portions of the first side and contacts the bottom major surface of the substrate; and
the second package body contacts the top major surface of the substrate.

5. The semiconductor device of claim 1, further comprising:
a third electrically conductive path extending vertically from the top major surface of the substrate towards a top exterior surface of the second package body; and
a fourth electrically conductive path extending vertically from the top major surface of the substrate towards to the top exterior surface of the second package body, wherein:
the electronic component is interposed between the third electrically conductive path and the fourth electrically conductive path in a cross-sectional view.

6. The semiconductor device of claim 5, wherein:
the third electrically conductive path comprises a third conductive via;
the fourth electrically conductive path comprises a fourth conductive via;
the third conductive via comprises a third outer surface exposed from the top exterior surface of the second package body;
the fourth conductive via comprises a fourth outer surface exposed from the top exterior surface of the second package body; and
the third outer surface and the fourth outer surface are adapted for receiving conductive solder structures.

7. The semiconductor device of claim 1, wherein:
the first semiconductor die is electrically coupled to one or more of the first electrically conductive path and the second electrically conductive path; and
the electronic component comprises a second semiconductor die.

8. A semiconductor device comprising:
a substrate having a top major surface and a bottom major surface opposite to the top major surface;
an electrically conductive pattern on the top major surface;
conductive lands on the bottom major surface including a first conductive land and a second conductive land;
conductive vias within the substrate electrically connecting portions of the electrically conductive pattern to the conductive lands, the conductive vias including a first conductive via connected to the first conductive land, wherein the first conductive via comprises a first width in a cross-sectional view;

a semiconductor component;

first bond pads on the semiconductor component;

conductive bumps directly connecting the first bond pads to the conductive lands other than the first conductive land and the second conductive land;

an electronic component mounted on the top major surface of the substrate;

a second bond pad on the electronic component;

a conductive interconnect directly connecting the second bond pad to the electrically conductive pattern;

a first package body portion encapsulating the semiconductor component, the conductive bumps, and at least portions of the bottom major surface of the substrate and comprising a bottom exterior surface distal to the bottom major surface of the substrate;

a second package body portion encapsulating the conductive interconnect and the electronic component;

a first electrically conductive path physically and electrically connected to the first conductive land and comprising a first outer surface exposed from the bottom exterior surface wherein the first electrically conductive path comprises a second width in the cross-sectional view that is greater than the first width; and a second electrically conductive path physically and electrically connected to the second conductive land and comprising a second outer surface exposed from the bottom exterior surface, wherein:

the second package body portion contacts the top major surface of the substrate; and the bottom exterior surface of the first package body portion is exposed outside of the semiconductor device.

9. The semiconductor device of claim 8, further comprising:

a third electrically conductive path coupled to and extending vertically upwards from the top major surface of the substrate; and a fourth electrically conductive path coupled to and extending vertically upwards from the top major surface of the substrate; wherein:

the second package body portion encapsulates at least portions of the third electrically conductive path and at least portions of the fourth electrically conductive path;

the conductive bumps comprise solder; and the electronic component is interposed between the third electrically conductive path and the fourth electrically conductive path.

10. The semiconductor device of claim 9, wherein:

one or more of the first electrically conductive path, the second electrically conductive path, the third electrically conductive path, or the fourth electrically conductive path comprise a via filled with a conductive material.

11. The semiconductor device of claim 9, wherein:

the third electrically conductive path comprises a third outer surface exposed from a top exterior surface of the second package body portion.

12. The semiconductor device of claim 8, wherein:

the first conductive via is laterally offset with respect to the first electrically conductive path in the cross-sectional view;

the electrically conductive pattern comprises portions that laterally overlap onto the top major surface of the substrate;

the first package body portion comprises a first thickness that defines the bottom exterior surface; and the semiconductor component, first electrically conductive path and the second electrically conductive path are confined within the first thickness.

* * * * *